(12) United States Patent
Vermeer et al.

(10) Patent No.: US 9,803,280 B2
(45) Date of Patent: Oct. 31, 2017

(54) METHOD AND APPARATUS FOR DEPOSITING ATOMIC LAYERS ON A SUBSTRATE

(71) Applicant: Nederlandse Organisatie voor toegepast-natuurwetenschappelijk onderzoek TNO, The Hague (NL)

(72) Inventors: Adrianus Johannes Petrus Maria Vermeer, The Hague (NL); Freddy Roozeboom, The Hague (NL); Joop Van Deelen, The Hague (NL)

(73) Assignee: Nederlandse Organisatie voor toegepast-natuurwetenschappelijk onderzoek TNO, The Hague (NL)

( * ) Notice: Subject to any disclaimer, the term of this patent is extended or adjusted under 35 U.S.C. 154(b) by 0 days.

(21) Appl. No.: 15/075,341

(22) Filed: Mar. 21, 2016

(65) Prior Publication Data

US 2016/0201194 A1 Jul. 14, 2016

Related U.S. Application Data

(62) Division of application No. 13/577,922, filed as application No. PCT/NL2011/050100 on Feb. 11, 2011, now Pat. No. 9,297,077.

(30) Foreign Application Priority Data

Feb. 11, 2010 (EP) ..................................... 10153381

(51) Int. Cl.
C23C 16/455 (2006.01)
C23C 16/54 (2006.01)
(Continued)

(52) U.S. Cl.
CPC ...... *C23C 16/45544* (2013.01); *C23C 16/458* (2013.01); *C23C 16/45551* (2013.01);
(Continued)

(58) Field of Classification Search
None
See application file for complete search history.

(56) References Cited

U.S. PATENT DOCUMENTS 2,782,090 A 2/1957 Robbart et al.
3,775,121 A 11/1973 Sharp
(Continued)

FOREIGN PATENT DOCUMENTS

CN 1474882 A 2/2004
CN 1507503 A 6/2004
(Continued)

OTHER PUBLICATIONS

International Search Report—PCT/NL2011/050100—Date of mailing: May 23, 2011.
(Continued)

*Primary Examiner* — Joseph Miller, Jr.
(74) *Attorney, Agent, or Firm* — Banner & Witcoff, Ltd.

(57) ABSTRACT

Method of depositing an atomic layer on a substrate. The method comprises supplying a precursor gas from a precursor-gas supply of a deposition head that may be part of a rotatable drum. The precursor gas is provided from the precursor-gas supply towards the substrate. The method further comprises moving the precursor-gas supply by rotating the deposition head along the substrate which in its turn is moved along the rotating drum.

19 Claims, 13 Drawing Sheets

(51) Int. Cl.
  *H01L 21/677* (2006.01)
  *C23C 16/52* (2006.01)
  *C23C 16/458* (2006.01)

(52) U.S. Cl.
  CPC .. *C23C 16/45563* (2013.01); *C23C 16/45589* (2013.01); *C23C 16/52* (2013.01); *C23C 16/545* (2013.01); *H01L 21/67784* (2013.01)

(56) References Cited

U.S. PATENT DOCUMENTS

| | | | |
|---|---|---|---|
| 4,389,973 | A | 6/1983 | Suntola et al. |
| 4,587,002 | A | 5/1986 | Bok |
| 4,628,238 | A | 12/1986 | Smulders et al. |
| 4,718,972 | A | 1/1988 | Babu et al. |
| 4,740,451 | A | 4/1988 | Kohara |
| 5,063,951 | A | 11/1991 | Bard et al. |
| 5,157,851 | A | 10/1992 | Younan |
| 5,443,861 | A | 8/1995 | Huhne |
| 5,641,608 | A | 6/1997 | Grunwald et al. |
| 5,993,916 | A | 11/1999 | Zhao et al. |
| 5,997,963 | A | 12/1999 | Davison et al. |
| 6,200,893 | B1 | 3/2001 | Sneh |
| 6,225,975 | B1 | 5/2001 | Furuki et al. |
| 6,255,039 | B1 | 7/2001 | Xu et al. |
| 6,451,695 | B2 | 9/2002 | Sneh |
| 6,475,910 | B1 | 11/2002 | Sneh |
| 6,495,233 | B1 | 12/2002 | Shmurun et al. |
| 6,582,767 | B1 | 6/2003 | Fukushima et al. |
| 6,602,784 | B2 | 8/2003 | Sneh |
| 6,630,401 | B2 | 10/2003 | Sneh |
| 6,638,862 | B2 | 10/2003 | Sneh |
| 6,641,673 | B2 | 11/2003 | Yang |
| 7,552,521 | B2 | 6/2009 | Fink |
| 7,572,686 | B2 | 8/2009 | Levy et al. |
| 7,850,780 | B2 | 12/2010 | Levy et al. |
| 8,110,254 | B1 | 2/2012 | Sharma et al. |
| 8,182,608 | B2 | 5/2012 | Kerr et al. |
| 8,303,713 | B2 | 11/2012 | Belousov et al. |
| 8,398,770 | B2 | 3/2013 | Levy et al. |
| 8,420,168 | B2 | 4/2013 | Kerr et al. |
| 2001/0010112 | A1 | 8/2001 | Maeda |
| 2002/0032073 | A1* | 3/2002 | Rogers ............ A63B 53/04 473/324 |
| 2002/0069826 | A1 | 6/2002 | Hunt et al. |
| 2002/0069827 | A1 | 6/2002 | Sakamoto et al. |
| 2004/0050685 | A1 | 3/2004 | Yara et al. |
| 2004/0052972 | A1 | 3/2004 | Schmitt |
| 2004/0058071 | A1 | 3/2004 | Galasco et al. |
| 2004/0058293 | A1 | 3/2004 | Nguyen et al. |
| 2004/0063320 | A1* | 4/2004 | Hollars ............ C23C 14/0057 438/689 |
| 2004/0112537 | A1 | 6/2004 | Yamazaki et al. |
| 2004/0129220 | A1 | 7/2004 | Saitoh et al. |
| 2005/0011441 | A1 | 1/2005 | Kannan |
| 2005/0011752 | A1 | 1/2005 | Yamazaki et al. |
| 2005/0227049 | A1 | 10/2005 | Boyack et al. |
| 2006/0130761 | A1 | 6/2006 | Sakai |
| 2006/0166132 | A1 | 7/2006 | Meagley |
| 2006/0177579 | A1 | 8/2006 | Shin et al. |
| 2007/0139304 | A1 | 6/2007 | Iwami et al. |
| 2007/0218702 | A1 | 9/2007 | Shimizu et al. |
| 2007/0228470 | A1 | 10/2007 | Levy |
| 2007/0238311 | A1 | 10/2007 | Levy |
| 2007/0281089 | A1 | 12/2007 | Heller et al. |
| 2008/0075858 | A1 | 3/2008 | Koh |
| 2008/0166884 | A1 | 7/2008 | Nelson et al. |
| 2008/0214012 | A1 | 9/2008 | Park et al. |
| 2008/0226838 | A1 | 9/2008 | Nishimura et al. |
| 2008/0260963 | A1 | 10/2008 | Yoon et al. |
| 2009/0078204 | A1 | 3/2009 | Kerr et al. |
| 2009/0081366 | A1 | 3/2009 | Kerr et al. |
| 2009/0081374 | A1 | 3/2009 | Yang et al. |
| 2009/0081827 | A1 | 3/2009 | Yang et al. |
| 2009/0081842 | A1 | 3/2009 | Nelson et al. |
| 2009/0081885 | A1 | 3/2009 | Levy et al. |
| 2009/0081886 | A1 | 3/2009 | Levy et al. |
| 2009/0155488 | A1 | 6/2009 | Nakano et al. |
| 2009/0165715 | A1 | 7/2009 | Oh |
| 2009/0217878 | A1 | 9/2009 | Levy et al. |
| 2009/0291209 | A1 | 11/2009 | Granneman et al. |
| 2010/0055317 | A1 | 3/2010 | Kato et al. |
| 2010/0173494 | A1 | 7/2010 | Kobrin |
| 2010/0248423 | A1 | 9/2010 | Nelson et al. |
| 2010/0258968 | A1 | 10/2010 | Zu |
| 2011/0005681 | A1 | 1/2011 | Savas et al. |
| 2011/0005682 | A1 | 1/2011 | Savas et al. |
| 2011/0006040 | A1 | 1/2011 | Savas et al. |
| 2011/0076421 | A1* | 3/2011 | Lee ............ C23C 16/045 427/569 |
| 2011/0097494 | A1* | 4/2011 | Kerr ............ C23C 16/45551 427/255.5 |
| 2011/0124199 | A1 | 5/2011 | Granneman et al. |
| 2011/0268879 | A1 | 11/2011 | Granneman et al. |
| 2011/0292622 | A1 | 12/2011 | Hovestad et al. |
| 2012/0003396 | A1 | 1/2012 | Maas et al. |
| 2012/0291707 | A1 | 11/2012 | Granneman |
| 2013/0043212 | A1 | 2/2013 | De Graaf et al. |
| 2013/0052347 | A1 | 2/2013 | Kuznetsov et al. |

FOREIGN PATENT DOCUMENTS

| | | |
|---|---|---|
| CN | 101207067 A | 6/2008 |
| CN | 101463473 A | 6/2009 |
| EP | 260097 A1 | 3/1988 |
| EP | 0370542 A1 | 5/1990 |
| EP | 0490118 A1 | 6/1992 |
| EP | 588242 A1 | 3/1994 |
| EP | 1340838 A1 | 9/2003 |
| EP | 1496138 A1 | 1/2005 |
| EP | 1592053 A1 | 11/2005 |
| EP | 2159304 A1 | 3/2010 |
| EP | 2211369 A1 | 7/2010 |
| GB | 1023897 A | 3/1966 |
| GB | 1114782 A | 5/1968 |
| GB | 0588242 A | 5/1974 |
| JP | H0659448 A | 3/1994 |
| JP | H0762232 A | 3/1995 |
| JP | H07286899 A | 10/1995 |
| JP | H08167666 A | 6/1996 |
| JP | H08228068 A | 9/1996 |
| JP | H10258181 A | 9/1998 |
| JP | H10274853 A | 10/1998 |
| JP | 3254179 B2 | 2/2002 |
| JP | 2002151494 A | 5/2002 |
| JP | 2003086516 A | 3/2003 |
| JP | 3411241 B2 | 5/2003 |
| JP | 2004111948 A | 4/2004 |
| JP | 2004349358 A | 12/2004 |
| JP | 2005050965 A | 2/2005 |
| JP | 2006167696 A | 6/2006 |
| JP | 2008085009 A | 4/2008 |
| JP | 2012511828 A | 5/2012 |
| JP | 5021932 B2 | 9/2012 |
| RU | 2041164 C1 | 8/1995 |
| RU | 2208658 C2 | 7/2003 |
| RU | 2264266 C1 | 11/2005 |
| RU | 2291223 C2 | 1/2007 |
| SU | 772601 A1 | 10/1980 |
| TW | 200926299 A | 6/2009 |
| WO | 00/42632 A1 | 7/2000 |
| WO | 0183852 A1 | 11/2001 |
| WO | 2004/012235 A2 | 2/2004 |
| WO | 2007106076 A2 | 9/2007 |
| WO | 2008/027215 A2 | 3/2008 |
| WO | 2008027215 A2 | 3/2008 |
| WO | 2008085474 A2 | 7/2008 |
| WO | 2009017322 A1 | 2/2009 |
| WO | 2009142487 A1 | 11/2009 |
| WO | 2009142488 A1 | 11/2009 |
| WO | 2011006018 A2 | 1/2011 |

(56) References Cited

FOREIGN PATENT DOCUMENTS

| WO | 2011041255 A1 | 4/2011 |
|---|---|---|
| WO | 2011/053446 A1 | 5/2011 |

OTHER PUBLICATIONS

International Search Report—PCT/NL2011/050112—Mailing date: May 26, 2011.

Xirong Jiang et al, Area-Selective ALD with Soft Lithographic Methods: Using Self-Assembled Monolayers to Direct Film Deposition, Department of Physics, and Department of Chemical Engineering, Stanford UniVersity, 2009 American Chemical Society Published on Web Sep. 3, 2009.

Hiroyuki Sugimura et al, Photolithography based on organosilane self-assembled monolayer resist, Department of Materials Processing Engineering, Graduate School of Engineering, Nagoya University, Department of Ecosystem Engineering, Graduate School of Engineering, The University of Tokushima, Elsevier Science Ltd, Electrochimica Acta 47 (2001) 103-107.

A. Pagani et al., Patterned Metallized Films: State-of-the-art and Growth Opportunities, Society of Vacuum Coaters, 50th Annual Technical Conference Proceedings (2007) ISSN 0737-5921.

International Search Report PCT/NL2011/050138—Mailing date: May 6, 2011.

International Search Report, Application No. PCT/NL2010/050491, dated Oct. 15, 2010.

European Search Report, Application No. EP07120262, dated Apr. 15, 2008.

International Search Report, Application No. PCT/NL2008/050712, dated Feb. 4, 2009.

International Search Report, Application No. PCT/NL2011/050128, dated Mar. 23, 2011.

International Search Report, Application No. PCT/NL2009/050755, dated May 25, 2010.

International Search Report, Application No. PCT/NL2009/050511, dated Oct. 14, 2009.

International Search Report, Application No. PCT/NL2011/050693, dated Nov. 7, 2011.

International Search Report—PCT/NL2011/050693—Mailing date: Jul. 11, 2011.

\* cited by examiner

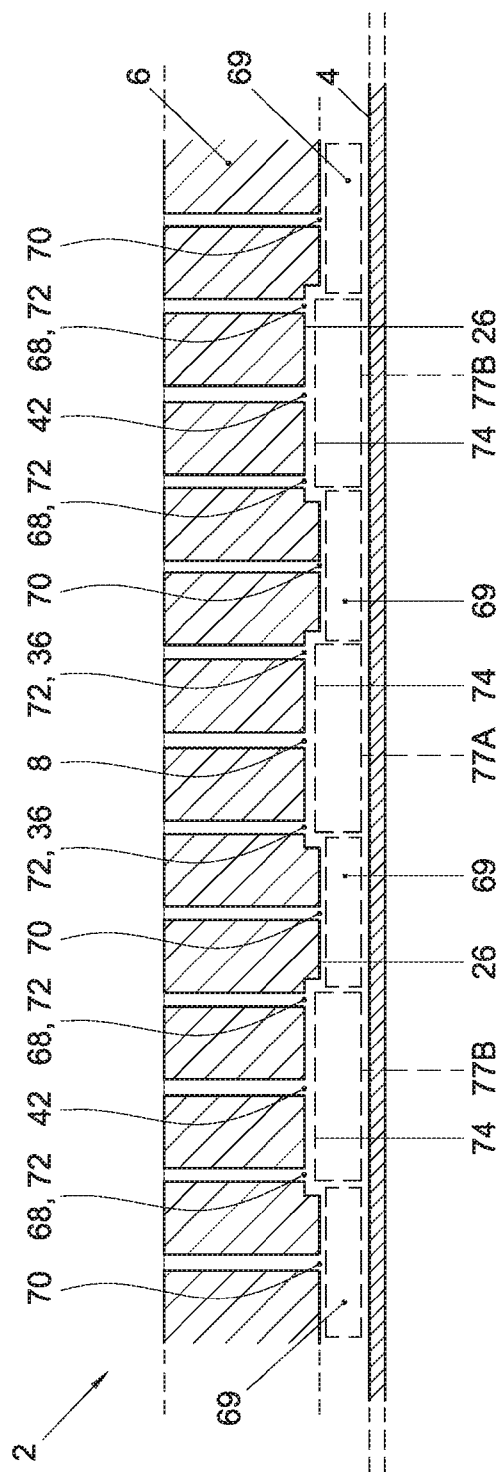
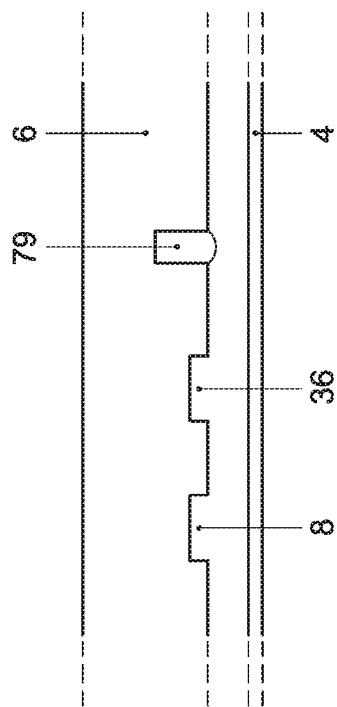
Fig. 6
Fig. 6A

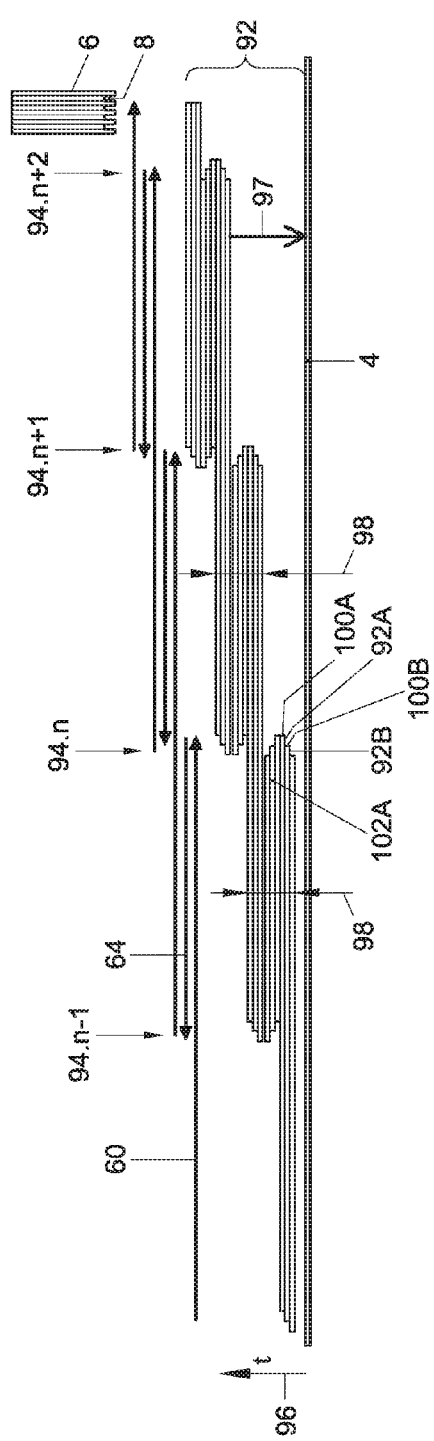
Fig. 10
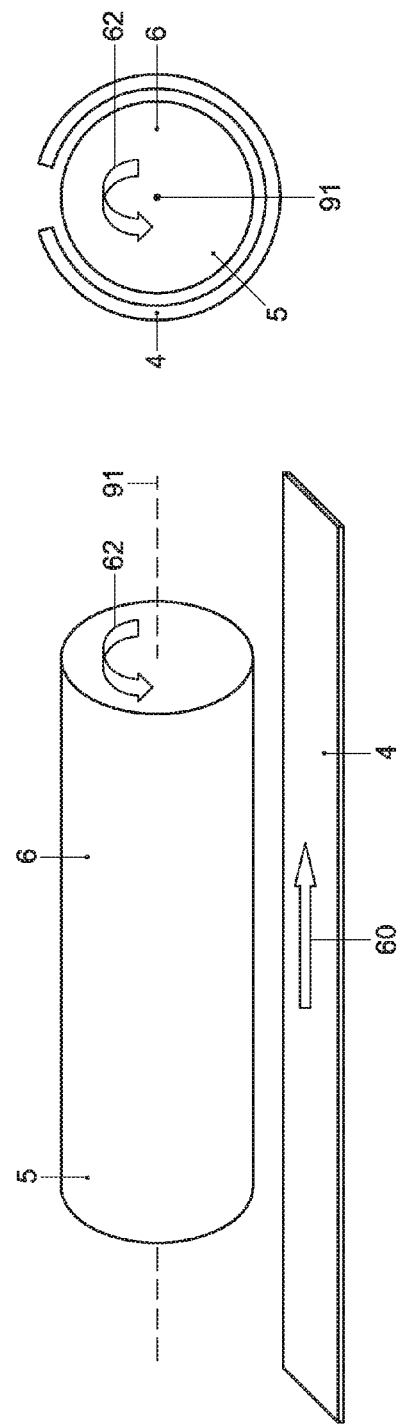
Fig. 11A
Fig. 11B

METHOD AND APPARATUS FOR DEPOSITING ATOMIC LAYERS ON A SUBSTRATE

CROSS-REFERENCE TO RELATED APPLICATIONS

This application is a divisional of U.S. application Ser. No. 13/577,922, filed Sep. 11, 2012, now U.S. Pat. No. 9,297,077, which is a U.S. National Stage application under 35 U.S.C. §371 of International Application PCT/NL2011/050100 (published as WO 2011/099858 A1), filed Feb. 11, 2011 which claims priority to Application EP 10153381.8, filed Feb. 11, 2010. Benefit of the filing date of each of these prior applications is hereby claimed. Each of these prior applications is hereby incorporated by reference in its entirety.

FIELD OF THE INVENTION

The invention relates to a method of depositing an atomic layer, preferably a stack of atomic layers, on a substrate, which method comprises supplying a precursor gas from a precursor-gas supply comprised by a deposition head towards the substrate. The invention also relates to an apparatus for depositing an atomic layer on a substrate, the apparatus comprising a deposition head having a precursor-gas supply for supplying a precursor gas towards the substrate. The invention also relates to the stack of atomic layers.

BACKGROUND OF THE INVENTION

Atomic layer deposition is known as a method for depositing a monolayer of target material. Atomic layer deposition differs from for example chemical vapour deposition in that atomic layer deposition takes at least two consecutive process steps (i.e. half-cycles). A first one of these self-limited process steps comprises application of a precursor gas on a substrate's surface. A second one of these self-limited process steps comprises reaction of the precursor material in order to form the monolayer of target material. Atomic layer deposition has the advantage of enabling excellent if not ideal layer thickness control. However, atomic layers are essentially thin. As a result, application of atomic layer deposition for depositing layers with a certain thickness larger than about 10 nanometers usually is rather time-consuming, because numerous atomic layers need to be stacked for obtaining such a layer thickness.

WO2007/106076 describes a method of atomic layer deposition wherein a substrate is mounted on a drum. This drum is rotated along a nozzle that supplies a precursor gas. In this way, multiple layer atomic layers can be deposited in a rather short time. However, the method of WO2007/106076 can only be applied on a substrate that has a length equal to or smaller than a circumference of the drum. In addition, the time necessary for mounting the substrate to the drum may at least partly or even completely undo the time gained by rotating the substrate rapidly along the nozzle.

SUMMARY OF THE INVENTION

It is an objective of the invention to provide a method of depositing an atomic layer that at least partly meets one or more of the problems of known methods.

Accordingly, the invention provides a method of depositing an atomic layer, preferably a stack of atomic layers, on a, e.g. flexible or rigid, substrate, which method comprises supplying a precursor gas from a precursor-gas supply, preferably from a plurality of precursor-gas supplies, comprised by a deposition head towards the substrate, comprises having the precursor gas react near, e.g. on, the substrate so as to form an atomic layer, and further comprises moving the precursor-gas supply along the substrate by rotating the deposition head while supplying the precursor gas.

In this way, a stack of atomic layers can be deposited while continuously moving (e.g. rotating) the precursor-gas supply and/or the substrate in one direction. Thus, moving the precursor-gas supply and/or the substrate in a reciprocating manner may be prevented when depositing the stack of atomic layers. In this way back-turning of the precursor head and/or the substrate, being inherent to reciprocating motion, can be prevented. As a result, a deposition rate of the atomic layers can be increased.

It is noted that US 2009/0081885 A1 does not disclose moving the precursor-gas supply along the substrate by rotating the deposition head while supplying the precursor gas. US 2009/0081885 A1 does also not disclose that thus a stack of atomic layers is deposited while continuously moving (e.g. rotating) the precursor-gas supply in one direction. The apparatus disclosed in US 2009/0081885 A1 is unsuitable for continuously rotating the precursor-gas supply in one direction while supplying the precursor gas.

The substrate may be a flexible substrate or a rigid, i.e. inflexible, substrate. Using a flexible substrate combines well with the rotating deposition head. Such a flexible substrate allows for bending the substrate which facilitates guiding the substrate around the rotating deposition head.

In an embodiment, the method comprises moving the substrate along the precursor-gas supply subsequently to and/or simultaneously with supplying the precursor gas towards the substrate. Moving the substrate along the precursor-gas supply subsequently to supplying the precursor gas towards the substrate enables the deposition of mutually isolated regions where stacked layers are deposited on the substrate. Moving the substrate along the precursor-gas supply simultaneously with supplying the precursor gas towards the substrate enables a rather continuous stacked layer that is built from atomic layers that are offset with respect to each other, i.e. that partially overlap. In this way, a seam between edges of atomic layers that extends perpendicularly to the substrate can substantially be prevented. The translational velocity of the precursor-gas supply relative to the substrate may be constant in time or may be varied in time.

In an embodiment, during depositing the atomic layer, the translational velocity of the precursor-gas supply is larger than and/or is directed against a translation velocity of the substrate. This further increases a deposition rate of the atomic layers. For example, an absolute value of the translational velocity of the precursor-gas supply can be at least 5 times, at least 10 times, at least 20 times, at least 50 times, at least 100 times, at least 500 times, at least 1000 times, at least 5000 times, and/or at least 10000 times larger than an absolute value of the translational velocity of the substrate. It may be clear that optionally the translational velocity of the precursor-gas supply may be directed in a direction of the translational velocity of the substrate.

In an embodiment, the precursor-gas supply is shaped in elongated form along, or inclined to, an axial direction of the deposition head, wherein the precursor-gas supply and/or the substrate are moved in a direction that is transverse to the axial direction defined by the rotating head movement. Such an elongated precursor-gas supply formed along or inclined to the axial direction may enable a homogeneous deposition of the atomic layer on the substrate.

In an embodiment, the deposition head has an output face that at least partly faces the substrate during depositing the atomic layer, the output face being provided with the precursor-gas supply. Hence, the precursor-gas supply may extend, along a curved output face, in a direction along or inclined with the axis of rotation of the deposition head.

In an embodiment, the output face has a substantially rounded, typically a substantially cylindrical or conical, e.g. frustoconical, shape and/or frustum shape, defining a movement path of the substrate. Hence, the output face may have a substantially cylindrical, conical, or frustum shape. Such an output face combines well with a rotating precursor head, because it enables maintaining, in use, a rather constant separation distance between the precursor head and the substrate.

It is noted that US 2007/0281089 A1 does not disclose a deposition head having an output face that: at least partly faces the substrate during depositing the atomic layer, is provided with the precursor-gas supply, and has a substantially rounded shape that defines a movement path of the substrate. It is further noted that US 2007/0281089 A1 does also not disclose a precursor-gas supply that is shaped in elongated form along, or inclined to, an axial direction of the deposition head, and does also not disclose that the precursor-gas supply may extend, along a curved output face, in a direction along or inclined with the axis of rotation of the deposition head. Instead, US 2007/0281089 A1 discloses an apparatus wherein an output face and a precursor-gas supply extend perpendicular to the axial direction and the axis of rotation. This hinders homogeneous deposition on the substrate. For example, deposition close to the axis of rotation will be different from deposition further away from the axis of rotation. Furthermore, at the position of the axis of rotation no deposition is possible. As a result, in US 2007/0281089 A1 the substrate is moved only over less than half of an area of an output face.

In an embodiment, moving the substrate along the precursor-gas supply comprises moving the substrate, preferably at least once or less than once, around the deposition head, preferably around the output face of the deposition head. Preferably, a first part of the substrate that is to be moved around the rotating deposition head at least once is located besides a second part of the substrate that has moved around the rotating substrate one time more than the first part of the substrate. Preferably, the first and second part of the substrate extend along the same line that is directed along the first and second part of the substrate and transverse to a moving direction of the substrate. In this way, the rotating precursor-gas supply may in use constantly face the substrate. As a result, leakage of the precursor gas can substantially be prevented. Hence, in this embodiment the problem of leakage (which may result in undesired reaction of precursor giving rise to contamination and particles) that may occur near a position where the substrate moves towards and reaches the deposition head, and/or near a position where the substrate moves away from and leaves the deposition head, may at least partly be solved. It is noted, that a number of times that the substrate is provided around the deposition head is not necessarily an integer.

In an embodiment, the method comprises draining the precursor gas that has leaked through a gap between the first and second part of the substrate.

In an embodiment, moving the substrate along the precursor-gas supply comprises moving the substrate along a helical path around the deposition head. The deposition head may be part of a rotatable drum. The drum may comprise a rotatable wheel with the deposition head attached thereto. The substrate may be moved along the helical path at least once around the deposition head and/or around the drum. In this way, it may be realized that the rotating precursor-gas supply may in use constantly face the substrate to provide a homogenous layer preferably over substantially the entire substrate area between opposed sides along the helical path. Specifically, the substrate may be positioned, in the helical path configuration, wherein opposed substrate sides face each other in such a way that no slit or only a very narrow slit is formed as a transition between the opposed substrate sides. In this way leakage may be substantially prevented and/or be substantially minimized.

In an embodiment, the substrate substantially faces the whole precursor-gas supply. Thus, in use, the rotating precursor-gas supply may constantly face the substrate.

In an embodiment, the method comprises confining the precursor gas by means of a sealing element that faces the deposition head outside locations where the substrate faces the deposition head. By means of the sealing element, flow of precursor gas to an outer environment of an apparatus with which the method can be carried out, may be substantially hindered or even prevented. The sealing element may extend along and/or in the gap between the first and second part of the substrate.

In an embodiment, the method comprises maintaining a separation distance between the substrate and the rotating deposition head. In this way, mechanical contact between the substrate and the rotating deposition head may be prevented. As a result, the translational velocity of the precursor-gas supply can be larger than and/or directed against the translational velocity of the substrate. Preferably, the separation distance is substantially constant around at least a part, and preferably, all of the circumference of the separation head.

In an embodiment, the method comprises attaching the substrate to a carrier and moving the carrier along the precursor-gas supply. By means of the carrier, the separation distance between the substrate and the rotating deposition head may be maintained. As a result, mechanical contact between the substrate and the rotating deposition head may be prevented. Preferably, the carrier comprises a mesh.

In an embodiment, the method comprises moving the carrier around a guide along a transportation face of the guide that is conformal with the output face and is facing the output face. By means of the conformal transportation face, the separation distance can be kept substantially constant over at least part of the output face.

In an embodiment, the method comprises supplying a bearing gas between the deposition head and the substrate for forming a gas-bearing layer that separates the substrate and the deposition head. In this way, a rather narrow separation distance between the rotating deposition head and the substrate may be maintained. The separation distance may e.g. be at most 200 micrometers, at most 100 micrometers, at most 15 micrometers, or at most 10 micrometers, e.g. around 5 micrometers. At the same time, the separation distance may be at least 3 micrometers, at least 5 micrometers, or at least 10 micrometers. Such small separation distances decrease an amount of excess precursor gas that is provided towards the substrate. This may be worthwhile as the precursor gas usage may usually add to production costs.

In an embodiment, the method comprises having the precursor gas react near, e.g. on, the substrate so as to form the atomic layer by selectively treating the deposited precursor material by means of a laser. Such selective treating may comprise controlling the laser for selectively treating the deposited precursor material. Selectively controlling the laser may comprise selectively controlling an intensity of the laser, e.g. turning the laser on and off to provide a raster type patterning. In such an embodiment, a laser switching time in conjunction with a relative velocity defines a pixel grid which can define very small in-plane patterning structures of for example 50 micrometers, or even less. Alternatively, selectively controlling the laser may comprise selectively diverting a beam of the laser away from the deposited precursor material. In this way, a patterned atomic layer may be deposited. E.g., when a part of the substrate where, according to an intended pattern, an atomic layer is to be deposited is adjacent to the reactant-gas supply, the laser may be turned on. E.g., when a part of the substrate where, according to the intended pattern, an atomic layer is not to be deposited is adjacent to the reactant-gas supply, the laser may be turned off. Preferably, the laser is comprised by, e.g. integrated in, the deposition head.

In an embodiment, the method comprises supplying the bearing gas from a bearing-gas supply of the deposition head towards the substrate for providing the gas-bearing layer.

In an embodiment, the method comprises supplying the precursor gas by means of the precursor-gas supply in a cavity that is defined in the deposition head and is facing the substrate, and draining the precursor gas by means of a precursor-gas drain of the deposition head from the cavity for substantially preventing precursor gas to escape from the cavity, the method further comprising supplying the bearing gas by means of the bearing-gas supply at a distance from the cavity. Such a cavity makes it possible to apply process conditions in the cavity that are different from process conditions in the gas-bearing layer. Preferably, the precursor-gas supply and/or the precursor-gas drain are positioned in the cavity. In the gas-bearing layer, i.e. near or adjacent to the bearing-gas supply, the separation distance may be at least 3 micrometers, at least 5 micrometers, at least 10 micrometers, and/or at most 15 micrometers. In the cavity the separation distance may be at most 500 micrometers, at most 200 micrometers, at most 100 micrometers, at most 50 micrometers, and/or at least 25 micrometers. Hence, the separation distance in the cavity may be in a range from 25 micrometers to at most 500 micrometers. The inventor recognised that the features of this embodiment may be applied more broadly, optionally in combination with one or more of the other embodiments and/or features described herein. Accordingly there is provided a method of depositing an atomic layer, preferably a stack of atomic layers, on a substrate, which method comprises supplying a precursor gas from a precursor-gas supply, preferably a plurality of precursor-gas supplies, comprised by a deposition head towards the substrate, and further comprises realizing relative motion between the precursor-gas supply and the substrate, wherein the method comprises supplying the precursor gas by means of the precursor-gas supply in a cavity that is defined in the deposition head and is facing the substrate, and comprises draining the precursor gas by means of a precursor-gas drain of the deposition head from the cavity for substantially preventing precursor gas to escape from the cavity, the method further comprising supplying the bearing gas by means of the bearing-gas supply at a distance from the cavity. Preferably, this method comprises having the precursor gas react near, e.g. on, the substrate so as to form the atomic layer. Preferably, this method is employed for manufacture of a photovoltaic panel or a part thereof. Preferably, the atomic layer is part of the photovoltaic panel or the part thereof. For example, the atomic layer may be part of a physical passivation layer, such as an aluminum oxide ($Al_2O_3$) layer. Alternatively, the atomic layer may be part of a layer that is different from a medium-k aluminum oxide ($Al_2O_3$) layer. For example, the atomic layer may be part of an antireflection layer, such as a silicon nitride ($Si_3N_4$) layer. The method may optionally include having the precursor gas react near, e.g. on, the substrate so as to form the atomic layer without exposing a monolayer of deposited precursor material to a plasma. Preferably, the precursor-gas supply and the precursor-gas drain are positioned in the cavity.

In an embodiment, the method is used for modifying a surface energy (e.g. hydrophobicity) of the substrate by means of the atomic layer. The method may e.g. be used for modifying the surface energy of a sheet of paper or a sheet of textile. The modification may e.g. be followed by adding a layer on the substrate having the modified surface energy, e.g. by means of printing or photolithography. Such methods may benefit from a well-defined surface energy that may be enabled by atomic layer deposition.

In an embodiment, the method comprises draining the precursor gas through the precursor-gas drain of the deposition head.

In an embodiment, the output face is provided with the cavity, the precursor-gas drain and/or the bearing-gas supply.

In an embodiment, the method comprises depositing a stack of atomic layers on the substrate, and comprises realizing relative reciprocating motion between the precursor-gas supply and the substrate, which reciprocating motion comprises back-turning a direction of motion between the precursor-gas supply and the substrate at two subsequent back-turning positions, wherein an atomic layer deposited between the back-turning positions is offset with respect to a previously deposited atomic layer. In this way, occurrence of a seam in the stack formed by a plurality of atomic layer edges aligned in a direction transverse to the substrate may be substantially prevented. This improves a uniformity of physical properties of the stack, as well as a strength of the stack. The inventor recognised that the features of this embodiment may be applied more broadly, optionally in combination with one or more of the other embodiments and/or features described herein. Accordingly, there is provided a method that comprises depositing a stack of atomic layers on the substrate, and further comprises realizing, e.g. linear, relative reciprocating motion between the precursor-gas supply and the substrate, which reciprocating motion comprises back-turning or reversing a direction of motion between the precursor-gas supply and the substrate at two subsequent back-turning positions or reversing positions, wherein an atomic layer deposited between the back-turning positions is offset with respect to a previously deposited atomic layer.

In an embodiment, an edge of the atomic layer deposited between the back-turning positions is at a different position from the substrate than a main part of the atomic layer deposited between the back-turning positions.

Preferably, the method is carried out by means of an apparatus according to the invention.

It is another objective of the invention to provide an improved stack of atomic layers.

Thereto the invention provides a stack of atomic layers deposited by means of a method according to the invention.

It is another objective of the invention to provide an apparatus for depositing an atomic layer that at least partly meets one or more of the problems of known apparatuses.

Thereto the invention provides an apparatus for depositing an atomic layer, preferably a stack of atomic layers, on a, e.g. flexible or rigid, substrate, the apparatus comprising a deposition head having a precursor-gas supply, preferably having a plurality of precursor-gas supplies, for supplying a precursor gas towards the substrate, the apparatus further comprising a mount for rotatably mounting the deposition head, preferably for mounting a drum that comprises the deposition head and/or for mounting a wheel on which the deposition head is mounted, and comprising a driver arranged for rotating the deposition head so as to move the precursor gas supply along the substrate; said deposition head being constructed for having the supplied precursor gas react near, e.g. on, the substrate so as to form an atomic layer. Optionally, the apparatus comprises the drum and/or the wheel. Hence, optionally, the apparatus comprises a drum that comprises the deposition head, wherein the mount is arranged for rotatably mounting the drum that comprises the deposition head. Preferably, the apparatus is arranged for moving the substrate along an, at least partly rounded, circumference of the rotatable drum.

With such an apparatus, a stack of atomic layers can be deposited while continuously moving the precursor-gas supply and/or the substrate in one direction. Thus, moving the precursor-gas supply and/or the substrate reciprocatingly may be prevented when depositing the stack of atomic layers. In this way back-turning of the precursor head and/or the substrate, being inherent to reciprocating motion, can be prevented. As a result, a deposition rate of the atomic layers can be increased.

In an embodiment, the apparatus comprises a transporter arranged to transport the substrate along the precursor-gas supply subsequently to and/or simultaneously with supplying the precursor gas towards the substrate.

In an embodiment, the driver is adapted for realizing and/or controlling a translational velocity of the precursor-gas supply that is larger than and/or directed against a translational velocity of the substrate. This may further increase the deposition rate of the atomic layers. For example, an absolute value of the translational velocity of the precursor-gas supply is at least 5 times, at least 10 times, at least 20 times, at least 50 times, at least 100 times, at least 500 times, at least 1000 times, at least 5,000 times, and/or at least 10,000 times larger than an absolute value of the translational velocity of the substrate. Preferably, the driver comprises a driving controller arranged for controlling the translational velocity of the precursor-gas supply. Preferably, the transporter comprises a transportation controller arranged for controlling the translational velocity of the substrate. It may be clear that optionally the translational velocity of the precursor-gas supply may be directed in a direction of the translational velocity of the substrate.

In an embodiment, the precursor-gas supply is shaped in elongated form along, or inclined to, an axial direction of the deposition head that is directed along or inclined to the substrate and transverse to a moving direction of the precursor-gas supply and/or the substrate. Thus, in this embodiment, the precursor-gas supply may have its largest dimension in a direction transverse to the moving direction of the precursor-gas supply and/or the substrate. As a result, a substantial part of the substrate can be covered by the atomic layer. Thus, in this embodiment, the precursor-gas supply may have its smallest dimension in the moving direction of the precursor-gas supply and/or the substrate. In this way, an amount of precursor gas used can be substantially minimised. Preferably, the axial direction is directed along the substrate and perpendicular to the moving direction of the substrate.

In an embodiment, the deposition head has an output face that in use at least partly faces the substrate and is provided with the precursor-gas supply.

In an embodiment, the output face has a substantially rounded, typically a substantially cylindrical, shape defining a movement path of the substrate. Such an output face combines well with a rotating precursor head, because it enables maintaining, in use, a rather constant separation distance between the precursor head and the substrate.

In an embodiment, the apparatus is provided in assembly with the, e.g. flexible, substrate, wherein the substrate is provided, preferably at least once or less than once, around the deposition head, preferably around the output face of the deposition head. Preferably, in use, a first part of the substrate that is to be moved around the rotating deposition head at least once is located besides a second part of the substrate that has moved around the rotating substrate one time more than the first part of the substrate. Preferably, in use the first and second part of the substrate extend along the same line that is directed along the first and second part of the substrate and transverse to a moving direction of the substrate. In this way, the rotating precursor-gas supply may in use constantly face the substrate. As a result, leakage of the precursor gas can substantially be prevented, especially near a position where the substrate moves towards and reaches the deposition head and near a position where the substrate moves away from and leaves the deposition head. An amount of times that the substrate is provided around the deposition head may be an integer or may not be an integer.

In an embodiment, the apparatus is provided with a leaked-gas drain for draining the precursor gas that has leaked through a gap between the first and second part of the substrate.

In an embodiment, the transporter comprises a guide. The guide may be adapted to guide the substrate along a helical path around the deposition head. The substrate may be provided along the helical path at least once around the deposition head, preferably at least once around the drum comprising the wheel with the deposition head. In this way, it may be realized that the rotating precursor-gas supply may in use constantly face the substrate. The guide may e.g. comprise at least one, e.g. two, capstans. The guide, e.g. the at least one capstan of the guide, preferably has a length axis inclined relative to a rotational axis of the deposition head; in such a way as to guide the substrate along a helical path around the deposition head.

In an embodiment, in use the substrate substantially faces the whole precursor-gas supply. Thus, in use, the rotating precursor-gas supply may constantly face the substrate.

In an embodiment, the apparatus comprises a sealing element for confining the precursor gas, wherein the sealing element faces part of the deposition head and extends between parts of the substrate. By means of the sealing element, undesired flow of precursor gas to an outer environment of the apparatus may be substantially hindered or even prevented. The sealing element may extend along and/or in the gap between the first and second part of the substrate.

In an embodiment, the apparatus is arranged for maintaining a separation distance between the substrate and the rotating deposition head. In this way, mechanical contact between the substrate and the rotating deposition head may be prevented. As a result, the translational velocity of the precursor-gas supply can be larger than and/or directed against the translational velocity of the substrate. Preferably, the separation distance is substantially constant around at least a part, and preferably all, of the circumference of the deposition head.

In an embodiment, the transporter comprises a carrier for attaching the substrate thereto, the transporter being arranged for moving the carrier along the deposition head. By means of the carrier, a separation distance between the substrate and the rotating deposition head may be maintained. As a result, mechanical contact between the substrate and the rotating deposition head may be prevented. Preferably, the carrier comprises a mesh or grid.

In an embodiment, the guide may be arranged for moving the carrier there around along a transportation face of the guide that is conformal with the output face. By means of the conformal transportation face, the separation distance can be kept substantially constant over at least part of the output face.

In an embodiment, the apparatus comprises a selectively controllable laser for reacting the precursor gas near, e.g. on, the substrate so as to form the atomic layer by selectively controlling the laser. By means of such a laser, the deposited precursor material may be selectively treated for reacting the deposited precursor material. Such selective controlling may comprises selectively controlling an intensity of the laser, e.g. turning the laser on and off. Alternatively, selectively controlling the laser may comprise selectively diverting a beam of the laser away from the deposited precursor material. In this way, a patterned atomic layer may be deposited. Such a patterned atomic layer may be useful for manufacturing openings in the atomic layer and/or for defining spatial variations in wettability on the substrate. The laser may be arranged for generating a plurality of beams. In use, the plurality of beams may be individually directed, e.g. in different directions, towards distinct precursor-gas supplies.

In an embodiment, the apparatus is provided with a bearing-gas supply for supplying a bearing gas between the deposition head and the substrate for forming a gas-bearing layer that separates the substrate and the deposition head. In this way, a rather narrow separation distance between the rotating deposition head and the substrate may be maintained. The separation distance may e.g. be at most 200 micrometers, at most 100 micrometers, at most 15 micrometers, or at most 10 micrometers, e.g. around 5 micrometers. At the same time, the separation distance may be at least 3 micrometers, at least 5 micrometers, or at least 10 micrometers. Such small separation distances reduce an amount of excess precursor gas that is provided towards the substrate. This may be worthwhile as the precursor gas may usually add to production costs.

In an embodiment, the deposition head comprises the bearing-gas supply, being arranged for supplying the bearing gas towards the substrate for providing the gas-bearing layer.

In an embodiment, the deposition head is provided with a cavity that, in use, faces the substrate and wherein the precursor-gas supply is preferably positioned in the cavity for supplying the precursor gas in the cavity towards the substrate, and wherein the deposition head is provided with a precursor-gas drain that is preferably positioned in the cavity for draining the precursor gas from the cavity for substantially preventing precursor gas to escape from the cavity, wherein the deposition head is further provided with a bearing-gas supply spaced apart from the cavity for supplying the bearing gas at a distance from the cavity. By having the cavity facing the substrate, it is understood that the substrate is substantially forming a closure for the cavity, so that a closed environment is formed for supplying the precursor gas. In addition, the substrate may be provided such that various adjacent parts of the substrate or even adjacent substrates may be forming such closure. A cavity thus formed makes it possible to apply process conditions in the cavity that are different from process conditions in the gas-bearing layer. In the gas-bearing layer, i.e. near or adjacent to the bearing-gas supply, the separation distance may be at least 3 micrometers, at least 5 micrometers, at least 10 micrometers, and/or at most 15 micrometers. In the cavity the separation distance may be at most 500 micrometers, at most 200 micrometers, at most 100 micrometers, at most 50 micrometers, and/or at least 25 micrometers. The inventor recognised that the features of this embodiment may be applied more widely, optionally in combination with one or more of the other embodiments and/or features described herein. Accordingly, there is provided an apparatus for depositing an atomic layer on a substrate, the apparatus comprising a deposition head having a precursor-gas supply, preferably a plurality of precursor-gas supplies, for supplying a precursor gas towards the substrate, the apparatus further comprising a driver arranged for realizing relative motion between the precursor gas supply and the substrate along the substrate; said deposition head being constructed for having the supplied precursor gas react near, e.g. on, the substrate so as to form an atomic layer.

In an embodiment, the deposition head is provided with a cavity that, in use, faces the substrate and wherein the precursor-gas supply is positioned in the cavity for supplying the precursor gas in the cavity towards the substrate, and wherein the deposition head is provided with a precursor-gas drain that is positioned in the cavity for draining the precursor gas from the cavity for substantially preventing precursor gas to escape from the cavity, wherein the deposition head is further provided with a bearing-gas supply spaced apart from the cavity for supplying the bearing gas at a distance from the cavity. Preferably, this apparatus is arranged and/or used for manufacture of a photovoltaic panel or a part thereof. Preferably, the atomic layer is part of the photovoltaic panel or the part thereof. Realizing relative motion between the precursor gas supply and the substrate along the substrate may comprise simultaneously holding the precursor-gas supply in rest and transporting the substrate may comprise simultaneously moving the precursor-gas supply and holding the substrate in rest, and/or may comprise simultaneously moving the precursor-gas supply and transporting the substrate.

In an embodiment, the deposition head comprises the precursor-gas drain for draining there through the precursor gas.

In an embodiment, the output face is provided with the precursor-gas drain, the cavity and/or the bearing-gas supply.

Other advantageous embodiments of the apparatus and method are described in the dependent claims.

BRIEF DESCRIPTION OF THE DRAWINGS

The invention will now be described, in a non-limiting way, with reference to the accompanying drawings, in which:

FIGS. 5 and 6 show variations of the apparatus 2 in the second embodiment, wherein the deposition head is provided with a cavity that, in use, faces a substrate;

FIG. 6A shows a variation of the deposition head in the second embodiment;

FIG. 10 shows a stack of layers and shows subsequent back-turning positions;

FIG. 11A shows an example wherein an axis of rotation of a deposition head is be aligned with a moving direction of a substrate; and FIG. 11B shows the deposition head in a viewing direction along the axis of rotation of the deposition head.

Unless stated otherwise, like reference numerals refer to like elements throughout the drawings.

DETAILED DESCRIPTION OF THE INVENTION

Figure 1:
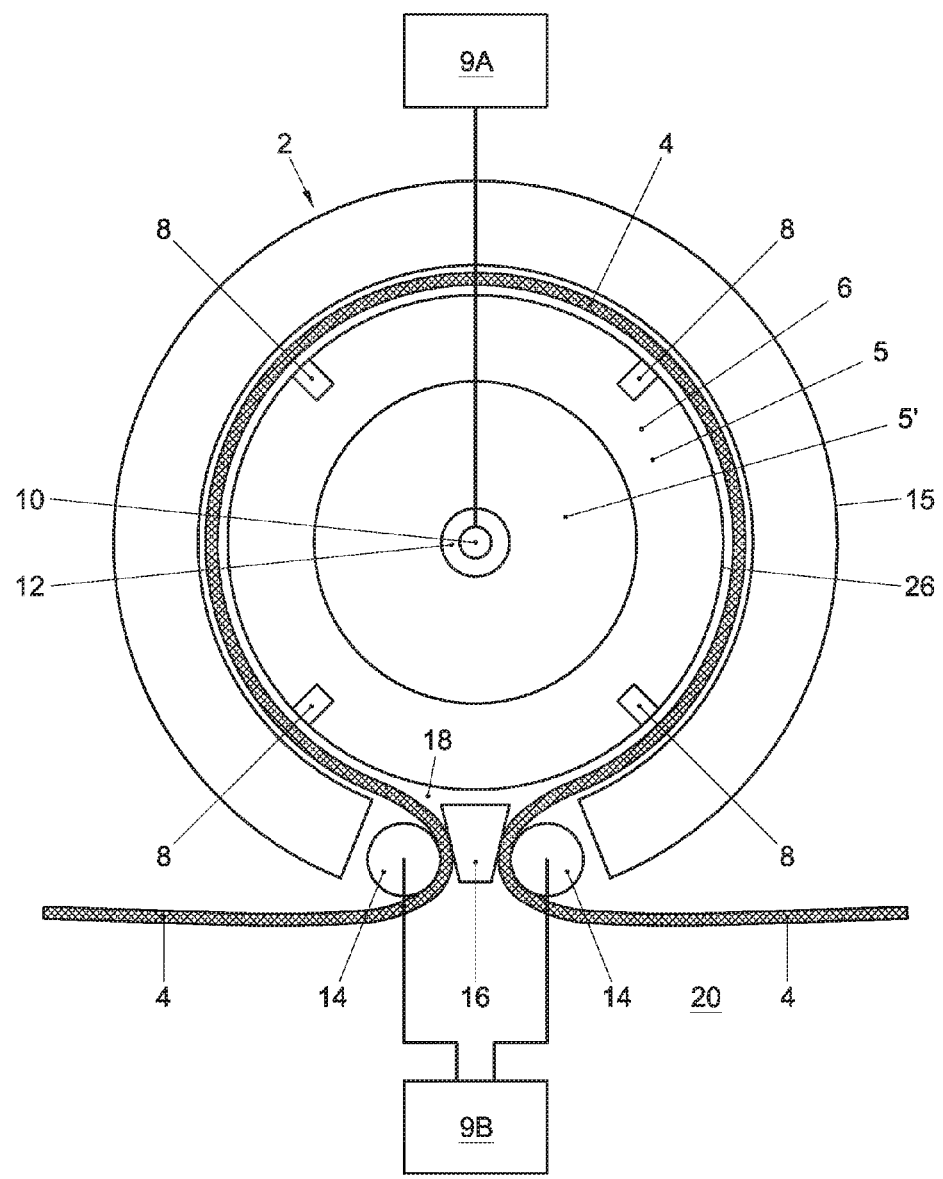
FIG. 1 shows an apparatus for depositing an atomic layer on a substrate, in a first embodiment according to the invention.

Atomic layer deposition is known as a method for depositing a monolayer of target material in at least two process steps, i.e. half-cycles. A first one of these self-limiting process steps comprises application of a precursor gas on the substrate surface. A second one of these self-limiting process steps comprises reaction of the precursor material in order to form the monolayer of target material on a substrate. The precursor gas can for example contain metal halide vapours, such as hafnium tetra chloride ($HfCl_4$), but can alternatively also contain another type of precursor material such as metalorganic vapours, for example tetrakis-(ethyl-methyl-amino) hafnium or trimethylaluminium ($Al(CH_3)_3$). The precursor gas can be injected together with a carrier gas, such as nitrogen gas, argon gas or hydrogen gas or mixtures thereof. A concentration of the precursor gas in the carrier gas may typically be in a range from 0.01 to 1 volume %, but can also be outside that range.

Reaction of the precursor gas may be carried out in a number of ways. First, a monolayer of deposited precursor material can be exposed to a plasma. Such plasma-enhanced atomic layer deposition is especially suitable for deposition of medium-k aluminum oxide ($Al_2O_3$) layers of high quality, for example for manufacturing semiconductor products such as chips and solar cells. Thus, the invention may e.g. be used for manufacturing solar cells, in particular for manufacturing flexible solar cells, by depositing one or more layers of a solar cell. Second, a reactant gas can be supplied towards the deposited monolayer of deposited precursor material. The reactant gas contains for example an oxidizing agent such as oxygen ($O_2$), ozone ($O_3$), and/or water ($H_2O$). Nitriding agents such as $N_2$, $NH_3$, etc. can be used alternatively to form nitrides such as silicon nitride ($Si_3N_4$).

In an example of a process of atomic layer deposition, various stages can be identified. In a first stage, the substrate surface is exposed to the precursor gas, for example hafnium tetrachloride. Deposition of the precursor gas is automatically terminated upon saturation of the substrate surface with a monolayer of by a single layer of chemisorbed precursor gas molecules. This self-limitation is a characteristic feature of the method of atomic layer deposition. In a second stage, excess precursor gas is purged using a purge gas and/or a vacuum. In this way, excess precursor molecules can be removed. The purge gas is preferably inert with respect to the precursor gas. In a third stage, the precursor molecules are exposed to a plasma or to a reactant gas, for example an oxidant, such as water vapour ($H_2O$). By reaction of functional ligands of the reactant with the remaining functional ligands of the chemisorbed precursor molecules, the atomic layer can be formed, for example hafnium oxide ($HfO_2$). In a fourth stage, excess reactant molecules are removed by purging. In addition, additional reactant stimulation systems may be used, for example, thermal, photonic or plasma excitation.

FIG. 1 shows an apparatus 2 for depositing an atomic layer on a, e.g. flexible, substrate 4, in a first embodiment according to the invention. The apparatus 2 comprises a deposition head 6 having precursor-gas supply 8. The deposition head 6 may be comprised by a rotatable drum 5. The drum 5 may comprise a rotatable wheel 5' with the deposition head 6 attached thereto. By means of the precursor-gas supply, precursor gas can be supplied towards the substrate 4. The apparatus 2 further comprises a mount arranged for rotating the precursor-gas supply along the substrate 4. The mount may comprise a bearing 12 that is arranged to receive an axle 10. The axle may be rigidly connected to the precursor-gas supply. Through the bearing 12, the axle 10 and the deposition head 6 can rotate with respect to the mount. An axis of rotation around which the deposition head can rotate may coincide with a center of the axle 10, e.g. with a length axis of the axle 10. The mount may thus be adapted for realizing a translational velocity of the precursor-gas supply along the substrate. Alternatively, other mounting embodiments may be applied that do not comprise axle 10 or bearing 12. In particular, the drum may be mounted via output face 26. Hence, it may, more in general, be clear that the axis of rotation of the deposition head may coincide with an axis of rotation of the drum.

The apparatus 2 may further comprise a driver that is connected to the axle 10 for driving the axle 10 and the deposition head. The driver may be provided with a driving controller 9A. By means of the driving controller, the driver may be adapted for realizing and controlling a translational velocity of the precursor-gas supply along the substrate. Such drivers and driver controllers are known as such so that a further description is deemed superfluous.

Figure 1A:
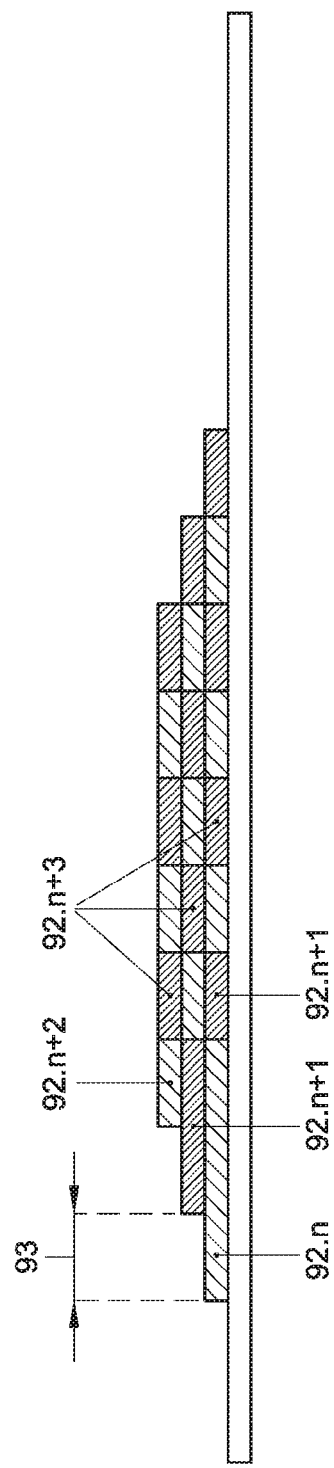
FIG. 1A shows an example of a stack of layers with offset.
Figure 1B:
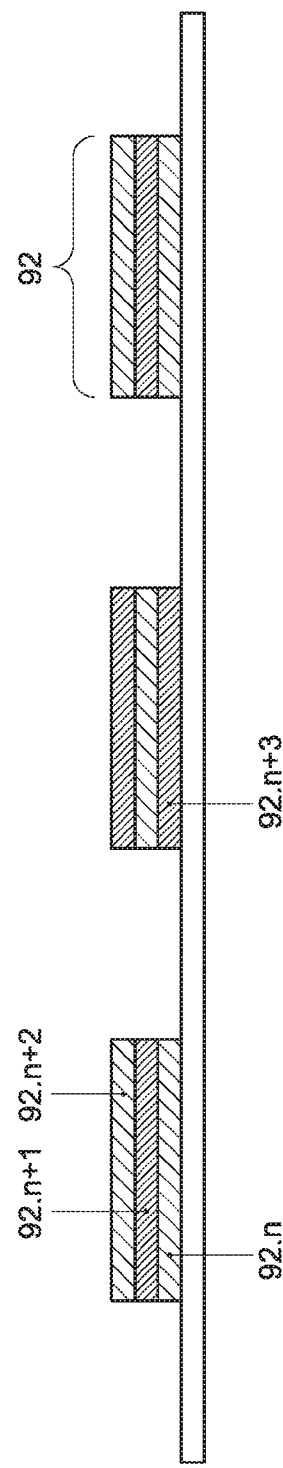
FIG. 1B shows an example of isolated stacks of layers.
Figure 1C:
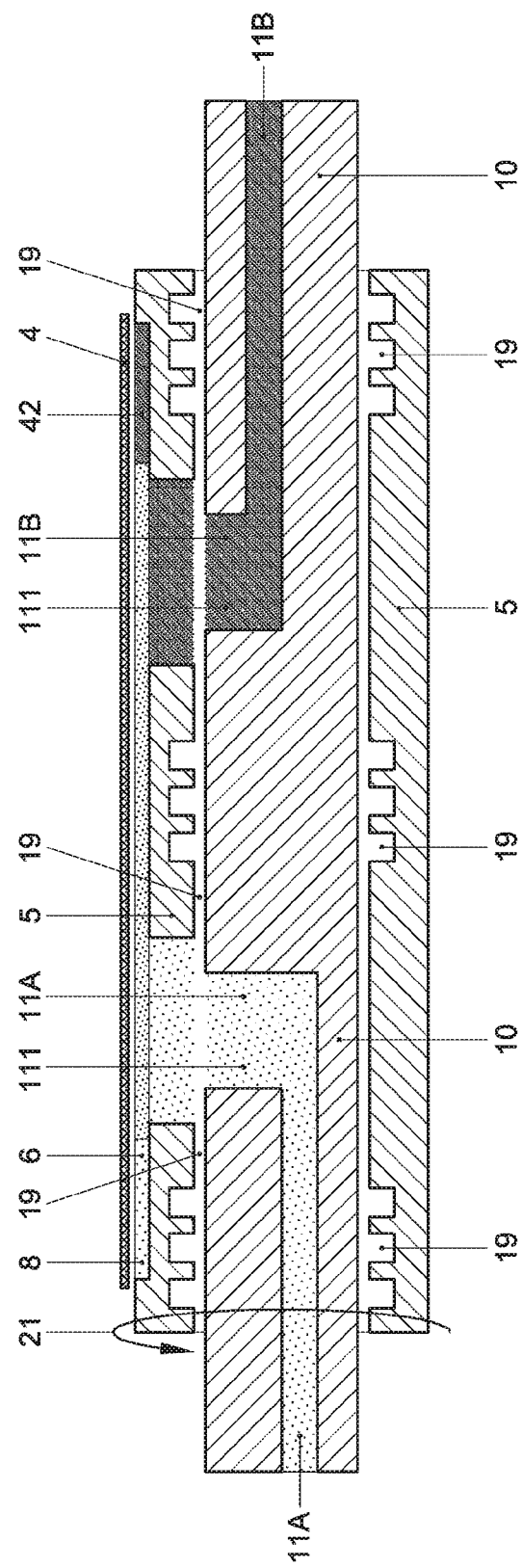
FIG. 1C shows a schematic cross section wherein a deposition head, a precursor-gas supply and optionally a drum are movable with respect to an axle.

The axle 10 may comprise an elongated cavity aligned along its axis. In use, the precursor gas may be transported through the cavity 11A of the axle. Thereto a gas supply structure may extend into the cavity of the axle. From the cavity 11A of the axle 10, the precursor gas may be transported to the precursor-gas supply. Ways to obtain a gas-tight connection between the gas supply structure and the axle that allows for rotational motion between the axle and the gas supply structure are known as such to the skilled person, so that a further description is considered superfluous. FIG. 1C shows an embodiment wherein the deposition head, the precursor-gas supply, and optionally the drum 5 are movable with respect to the axle 10. A mount of the apparatus may comprise the axle 10. FIG. 1C shows a schematic cross-section of the axle 10 provided with a first, e.g. elongated, axle cavity 11A for supplying the precursor gas through the axle towards the precursor-gas supply. In the cross-section of FIG. 1C, the deposition head 6 and the substrate 4 are visible at only one side of the cross-section. However, in an embodiment, other cross-sections may be possible wherein the deposition head 6 and/or the substrate 4 is visible at two sides of the cross-section. The axle 10 may be provided with a second, e.g. elongated, axle cavity 11B for supplying an additional gas through the axle towards the deposition head. For example, the second axle cavity 11B may be arranged for supplying a reactant gas through the axle towards a reactant-gas supply 42. Alternatively, the second axle cavity 11B may be arranged for supplying a purge gas through the axle towards a purge-gas supply 38. The axle cavities 11A, 11B may be comprised by an axle feed-through 111 for supplying at least the precursor gas through the axle towards the precursor supply. Advantageously, an axle gas bearing 19 may be provided in between the axle on one hand and the drum anchor the deposition head on the other hand. A bearing pressure in the axle gas bearing may be controlled to substantially prevent leakage out of the axle cavities 11A, 11B. Such an axle gas bearing may decrease the amount of particles that is generated during rotation, compared to e.g. sliding mechanical contact between the axle and the drum or between the gas supply structure and the axle. The axle gas bearing 19 may provide for a gas connection between the axle on one hand and the rotating drum and/or the deposition head on the other hand that substantially prevents leakage of precursor gas through the axle gas bearing. Thus, the mount may be provided with a mount gas bearing, e.g. the axle gas bearing, that forms part of an enclosure of a gas connection between a gas supply and/or drain structure (not drawn but e.g. conventional) on one hand, and the deposition head on the other hand. A pressure in said mount gas bearing may be arranged for preventing leakage of precursor gas through the mount gas bearing out of the gas connection. At the same, the mount gas bearing may be arranged for allowing rotation of the deposition head with respect to the gas supply and/or drain. Rotation of the deposition head 6 and the precursor-gas supply 8, and optionally of the drum 5, is indicated with arrow 21. In such an embodiment, the axle may in use be stationary. Then, the axle may be rigidly connected to the gas supply structure. Additionally, or alternatively, the apparatus may in an embodiment be provided with a cartridge that contains the precursor gas. Then, the gas-tight connection may be omitted. Transport of other gasses can be analogous to the transport of the precursor gas towards the precursor gas supply as described hereinbefore.

Thus, more in general, the mount may comprise an axle for, optionally rotatably or rigidly, mounting the deposition head and/or the drum thereon. The axle may be provided with an axle feed-through, e.g. an axle cavity, for supplying at least the precursor gas through the axle towards the precursor-gas supply. A method according to the invention may comprise: providing the deposition head and/or the drum mounted on an axle; providing at least the precursor gas through the axle towards the precursor-gas supply. The mount may be provided with a mount gas bearing that forms part of an enclosure of a gas connection between a gas supply and/or drain structure on one hand, and the deposition head on the other hand. A pressure in said mount gas bearing may be arranged for preventing leakage of gas through the mount gas bearing out of the gas connection. The mount gas bearing may be arranged for allowing rotation of the deposition head with respect to the gas supply and/or drain. The apparatus 2 may comprise a transporter system to transport the substrate along the precursor-gas supply. The transporter may comprise a closure element or guide 15 for transporting the substrate 4 along the precursor-gas supply 8 and deposition head 6, as further illustrated in FIGS. 3A and 3B. Furthermore, such a transporter, e.g. such a guide, may comprise capstans 14. The capstans may be stationary. However, preferably, the capstans are rolling capstans, i.e. capstans that can be rotated around an axis of symmetry or a length axis of the capstans 14. The transporter may further comprise a transportation controller 9B for controlling a velocity with which the substrate 4 passes the rolling capstans 14. Such a transportation controller 9B is known as such so that a further description is seemed superfluous. The transportation controller may for example control a rotation velocity of one or both of the rolling capstans 14. Thereto the transportation controller 9B may be connected to the rolling capstans 14.

Thus, by means of the transportation controller 9B and the driving controller 9A, respectively, a translational velocity of the substrate and the translational velocity of the precursor-gas supply can be controlled. Preferably, the translational velocity of the precursor-gas supply is larger than the translational velocity of the substrate. In this way, relative movement between the precursor-gas supply and the substrate with a relatively high velocity can be obtained. The translational velocity of the substrate may e.g. be approximately 0.1 m/s. For all embodiments presented herein, the precursor head may rotate with a frequency of at least 0.1 or 1 revolution per second. The precursor head may rotate with a frequency of e.g. approximately 30 revolutions per second. The translational velocity of the precursor-gas supply may e.g. be approximately 1 m/s. Furthermore, as the precursor-gas supply in use rotates, the precursor-gas supply can move in a continuous fashion in the same direction along one and the same part of the substrate 4 a plurality of times. In this way, a plurality of atomic layers can be deposited on the substrate. In this way one relatively thick composite layer can be obtained that comprises a plurality of atomic layers that may mutually overlap. Hence, more in general, the precursor-gas supply may rotate continuously in the same direction, along one and the same part of the substrate a plurality of times, for obtaining a composite layer that comprises a plurality of atomic layers that mutually overlap. Hence, it may be clear that terms like 'rotate(s)' and 'rotating' used herein may mean e.g. 'revolve(s)', respectively, revolving', 'gyrate(s)', respectively, 'gyrating', or 'spin(s)', respectively, 'spinning'. Hence, an apparatus according to the invention may be arranged for rotating the precursor-gas supply continuously in the same direction, along one and the same part of the substrate a plurality of times, for obtaining a composite layer that comprises a plurality of atomic layers that mutually overlap.

The velocity of relative movement can even be increased if the translational velocity of the precursor-gas supply is directed against a translational velocity of the substrate.

In a variation, the transportation controller and the driving controller are arranged for moving the substrate simultaneously with supplying the precursor gas towards the substrate. In this way, an offset may be realized between subsequently deposited atomic layers. In this way, a seam between edges of atomic layers that extends perpendicularly to the substrate can substantially be prevented. FIG. 1A shows an example of a stack of atomic layers $92.i$ (i=n, n+1, . . . ) with offset 93 deposited in this way.

The offset 93 may, more in general, depend on the translational velocity of the precursor-gas supply and of the substrate. It may e.g. be clear that, if the precursor-gas supply 8 and the substrate 4 move in the same direction and the translational velocity of the precursor-gas supply is larger than the translational velocity of the substrate 4, the offset 93 may then decrease if the translational velocity of the precursor-gas supply 8 increases.

In another variation, the transportation controller and the driving controller are arranged for moving the substrate subsequently to supplying the precursor gas towards the substrate. In that case, the substrate is not moved when supplying the precursor gas towards the substrate. When a stack of layers is deposited in this way, supplying the precursor gas towards the substrate may be stopped when moving the substrate. In this way, an isolated stack of layers may be deposited on the substrate 4. FIG. 1B shows an example of isolated stacks 92 of layers $92.i$ (i=n, n+1, . . . ) deposited in this way. The stack 92 may typically comprise approximately a hundred to a thousand atomic layers, three of which are drawn in FIG. 1B.

The apparatus 2 may further comprise a sealing element 16. By means of the sealing element, the precursor gas can be substantially enclosed or confined. The sealing element 16 faces part of the deposition head and/or the rotatable drum 5 and extends between parts of the substrate 4, in this example parts of the substrate that are in mechanical contact with the capstans 14. With the insertion of sealing element 16, precursor gas can be substantially enclosed or confined to a space 18 bounded by the deposition head, the substrate 4, and the sealing element 16. In the space 18, a gas bearing may be created by gas injected from the precursor head, as will later be explained with reference to FIGS. 4-6. Without the sealing element 16, precursor gas may leak away towards an outer environment 20 of the apparatus 2. This may result in unwanted contamination and particles formed on the substrate.

Figure 2A:
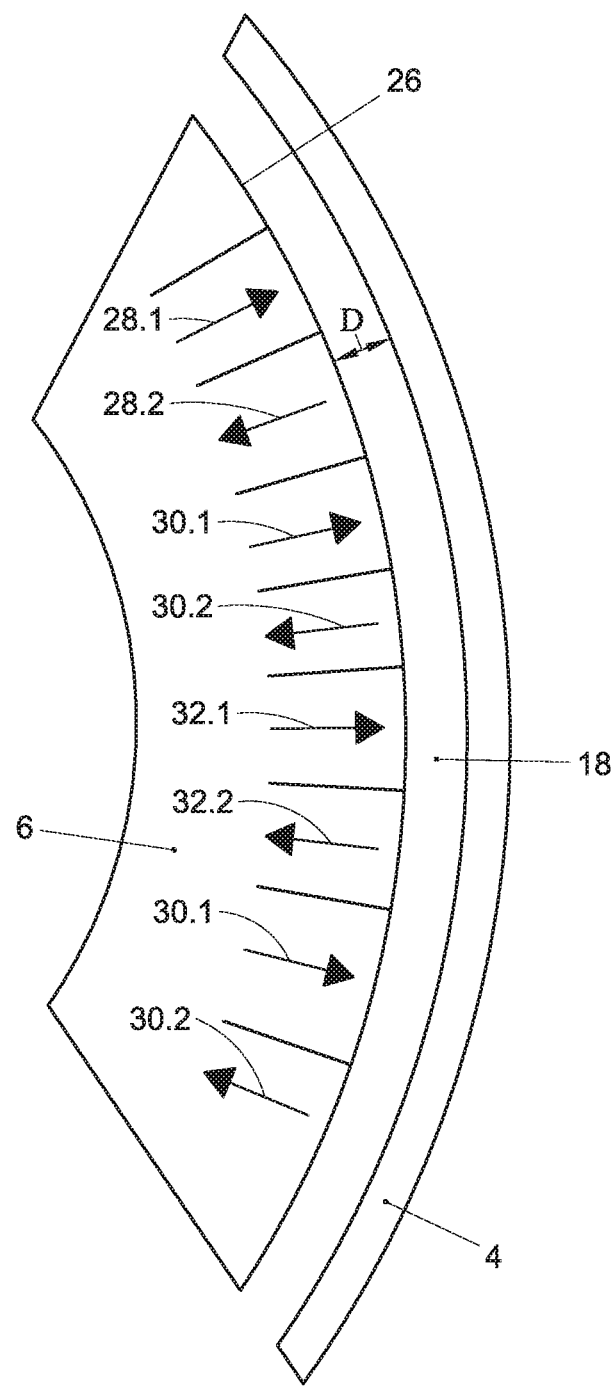
FIG. 2A schematically shows a basic functional part of a deposition head of the apparatus 2 in the first embodiment, and a substrate.

FIG. 2A schematically shows a basic functional part of the deposition head 6 of the apparatus 2 in the first embodiment, and the substrate 4. FIG. 2A illustrates how, along an output face 26 of the precursor head 6, gasses may be supplied and drained. In FIG. 2A, arrow 28.1 indicates supply of the precursor gas. Arrow 28.2 indicates draining of the precursor gas. Arrow 30.1 indicates supply of the purge gas. Arrow 30.2 indicates draining of the purge gas. Arrow 32.1 indicates supply of the reactant gas. Arrow 32.2 indicates draining of the reactant gas. The supply of purge gas in between location of supply of active gasses, e.g. the reactant gas and the precursor gas, in use spatially divides the active gasses. The basic functional part shown in FIG. 2A may be repeated along the circumference of the rotatable drum 5. Hence, more in general, the precursor-gas supply is located, and preferably repeated, along the circumference of the rotatable drum and/or along the circumference of the output face.

Figure 2B:
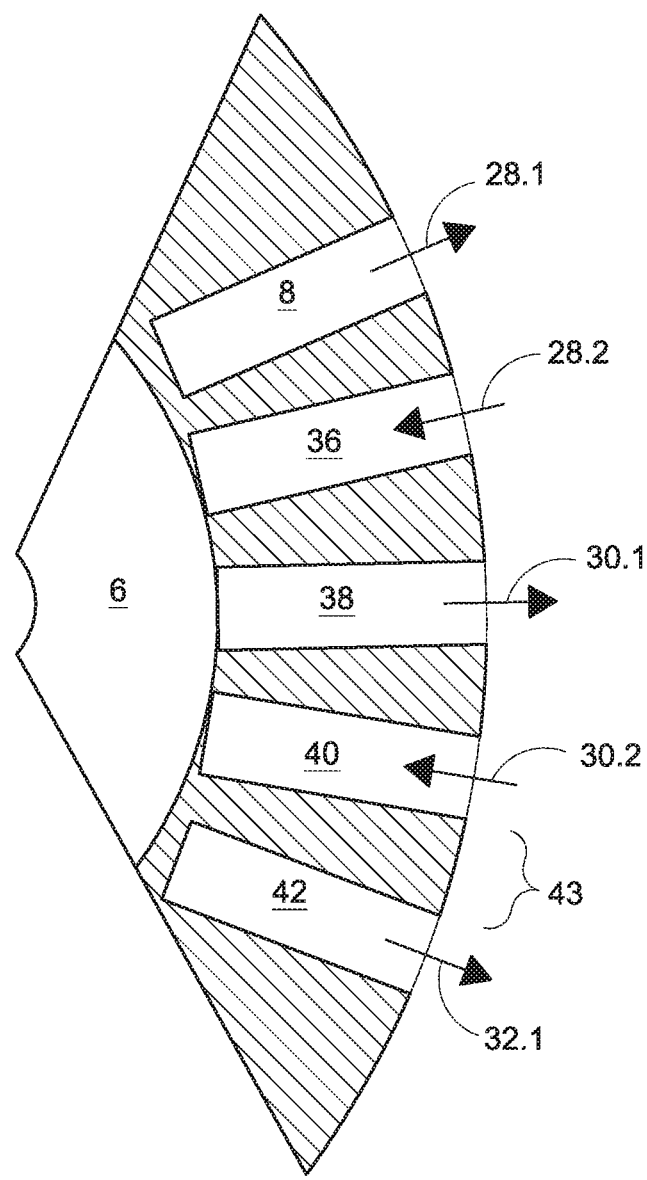
FIG. 2B partly shows a possible structure of a part of the deposition head shown in FIG. 2A.

FIG. 2B partly shows a possible structure of the part of the deposition head shown in FIG. 2A. FIG. 2B shows the precursor-gas supply 8, which can be used for a first reaction half-cycle. FIG. 2B further shows that the deposition head may have a precursor-gas drain 36 for draining of the precursor gas. The deposition head 6 may further have a purge-gas supply 38 and a purge-gas drain 40, for respectively supplying the purge gas towards the substrate and draining the purge gas away from the substrate. The deposition head may further have a reactant-gas supply 42 for supplying the reactant gas towards the substrate 4, which can be used for the second reaction half-cycle. The reactant gas supply functions as a means to have the precursor-gas react near, e.g. on, the substrate so as to complete the formation of an atomic layer. It may be clear that in this way the purge gas is supplied in between the reactant gas and the precursor gas in order to spatially divide zones associated with respectively the reactant gas and the precursor gas. This may prevent reaction of the purge gas and the reaction gas at positions other than on the substrate 4. In addition, or alternatively, other reactant systems may be used, for example, thermal, photonic or plasma excitation.

More in general, gas supplies, e.g. the precursor-gas supply, the reactant-gas supply, and the purge-gas supply may be spaced apart from each other and from gas drains, e.g. the precursor-gas drain, the reactant-gas drain, and the purge-gas drain, by a separation length 43.

Figure 3A:
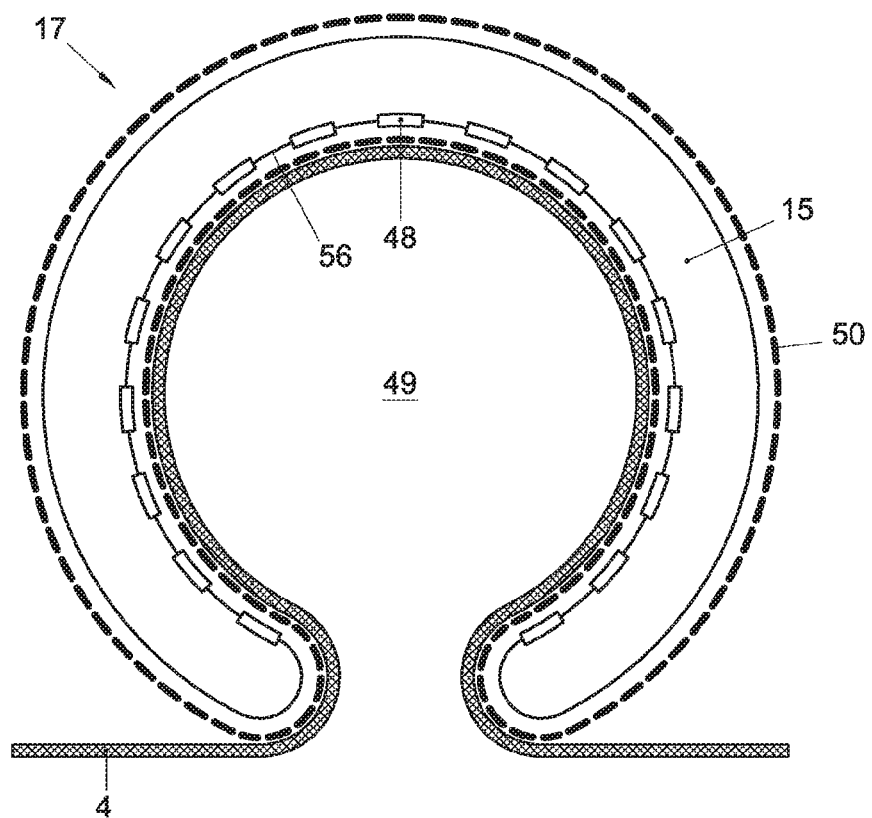
FIGS. 3A and 3B show a part of a transporter.
Figure 3B:
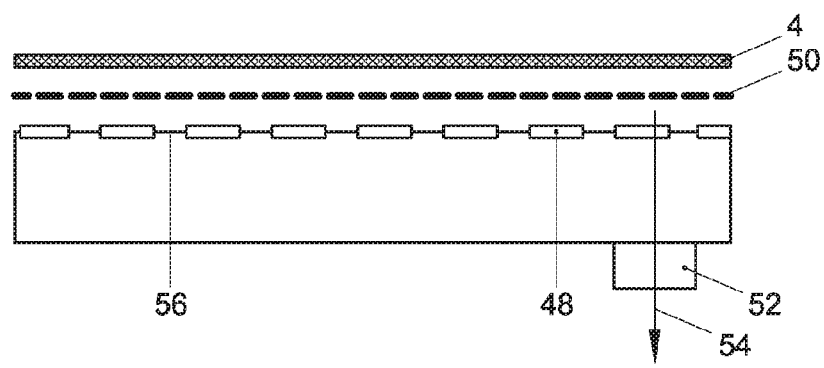

FIGS. 3A and 3B show a part of the transporter 17. FIGS. 3A and 3B show the guide 15 comprised by the transporter. In use, the precursor-gas supply may rotate inside a central space 49 that may be enclosed by the guide 15. The guide 15 may have a mesh 48 attached to an inner lining of the guide or closure element 15. The transporter may further comprise a carrier 50 for attaching the substrate 4 thereto by means of pressure. The carrier 50 may comprise a mesh. Thereto the transporter may comprise a vacuum port 52 for creating a vacuum between the substrate 4 and the carrier 50. Arrow 54 indicates how gas can be sucked away through the vacuum port 52 to attach the substrate 4 to the carrier 50. In use, the carrier can be moved around the guide 15, along a transportation face 56 of the guide 15 that is conformal with the output face 26. Other methods of attaching the substrate to the carrier 50 are possible as well.

Figure 4:
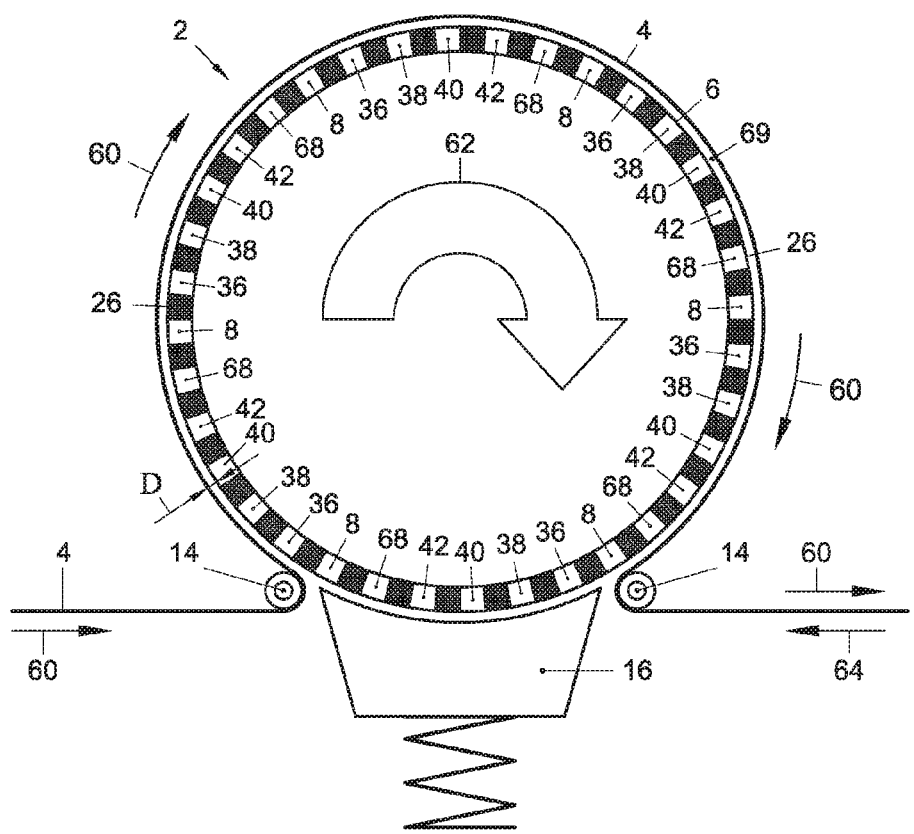
FIG. 4 shows an apparatus 2 for depositing an atomic layer on a substrate 4, in a second embodiment according to the invention.

FIG. 4 shows an apparatus 2 for depositing an atomic layer on a substrate 4, in a second embodiment according to the invention. FIG. 4 shows the deposition head 6 and the sealing element 16 of the apparatus 2. A moving direction of the substrate 4 is indicated by arrows 60. A rotating direction of the deposition head, and a moving direction of the precursor-gas supply along the substrate, is indicated by arrow 62. It may thus be clear that in this example the translational velocity of the precursor-gas supply is directed in a direction of the translational velocity of the substrate. If, for example, the substrate would move in the direction of arrow 64, the translational velocity of the precursor-gas supply along the substrate would be directed against the translational velocity of the substrate.

The apparatus 2 in the second embodiment further shows the output face 26 of the deposition head 6. In FIG. 4, the output face in use faces a part of the substrate 4. In FIG. 4, the output face faces substantially either the substrate 4 or the sealing element 16. The output face 26 may have a substantially cylindrical shape. It may be clear that in this example the output face 26 defines a movement path of the substrate, as in use the output face is separated from the substrate by a separation distance D (see also FIG. 2A). It may further be clear that the output face 26 in this example is substantially rounded along the entire circumference of the output face 26 around the axis of rotation of the deposition head. In other examples however, the output face 26 may e.g. be flat over part of the circumference of the output face 26 around the axis of rotation of the deposition head. Hence, more in general, the output face may be substantially rounded along at least part of the circumference of the output face around the axis of rotation of the deposition head and/or around the axis of rotation of the drum.

The output face 26 may be provided with the precursor-gas supply 8, in this example with a plurality of precursor-gas supplies 8. The output face 26 may further be provided with the precursor-gas drain 36, in this example with a plurality of precursor-gas drains 36. The output face 26 may further be provided with the purge-gas supply 38, in this example with a plurality of precursor-gas supplies 38. The output face 26 may further be provided with the purge-gas drain 40, in the example with a plurality of purge-gas drain 40. The output face 26 may further be provided with the reactant-gas supply 42, in this example with a plurality of reactant-gas supplies 42. The output face 26 may further be provided with a reactant-gas drain 68, in this example with a plurality of reactant-gas drains 68.

Figure 4A:
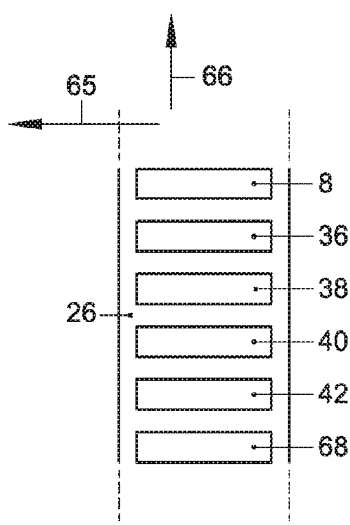
FIG. 4A shows an example of an output face provided with elongatedly shaped supplies.

The gas supplies 8, 38, 42 and/or the gas drains 36, 40, 68 may be elongatedly shaped, i.e. shaped in elongated form, in an axial direction of the deposition head 6 and the drum 5. An array of gas supplies, e.g. precursor-gas supplies, may be regarded as a gas supply, e.g. a precursor-gas supply, being shaped in elongated form. In general, the axial direction may be aligned with, or coincide with, the axis of rotation of the deposition head. Hence, it may, more in general, be clear that the axis of rotation of the deposition head may coincide with an axis of rotation of the drum. FIG. 4A shows an example of the output face provided with the elongatedly shaped supplies. The axial direction 65 may be directed along the substrate 4 and transverse to a moving direction 66 of the supplies and/or to the moving direction 60 of the substrate 4. This moving direction is to be evaluated adjacent to the supply.

In use, the precursor gas, the reactant gas, and the purge gas may form a gas bearing between the substrate 4 and the output face 26. Thereto the apparatus 2 may comprise a gas controller for controlling the supply and drainage of the precursor gas, the reactant gas, and/or the purge gas, thus supplying gasses for forming a gas-bearing layer 69 of the gas bearing between the substrate 4 and the output face 26. By means of such a gas-bearing layer, the substrate can be separated from the deposition head. In this way, mechanical contact between the output face 26 and the substrate 4 can substantially be prevented. This allows the translational velocity of the precursor-gas supply and the translational velocity of the substrate to have a different magnitude and/or a different direction. In this example, the purge-gas supply functions as a bearing-gas supply 70 for supplying the bearing gas, e.g. the purge gas, between the deposition head and the substrate for forming the gas-bearing layer 69 that separates the substrate and the deposition head. Thus, in this example, the deposition head comprises the bearing-gas supply, being arranged for supplying the bearing gas towards the substrate for providing the gas-bearing layer 69. It may be clear that, in this example, the purge-gas drain 40 functions as a bearing-gas drain 72. It may also be clear that the separation distance D may be representative for a thickness of the gas bearing layer between the substrate 4 and a surface of the output face 26.

More in general, the gas-bearing layer in use typically shows a strong increase of the pressure in the gas-bearing layer as a result of the close proximity of the substrate 4 towards the output face 26. For example, in use the pressure in the gas-bearing layer at least doubles, for example typically increases eight times, when the substrate moves two times closer to the output face, ceteris paribus. Preferably, a stiffness of the gas-bearing layer in use is between $10^3$ and $10^{10}$ Newton per millimeter, but can also be outside this range. In use, the substrate 4 may float against the gas-bearing layer.

More in general, the apparatus may be arranged for applying a pre-stressing force on the substrate directed towards the deposition head. In use, the pre-stressing force increases a stiffness of the gas-bearing layer. Such an increased stiffness reduces unwanted movement out of a plane of the substrate surface. As a result, the substrate can be provided more closely to the substrate surface, without touching the substrate surface. The pre-stressing force may e.g. be applied by a (pre)tensioning the substrate 4, for instance, by a spring guide, such as a capstan that is pretensioned. The spring guide may be somewhat distanced from the capstans 14. Other ways of applying the pre-stressing force are possible as well.

Figure 5:
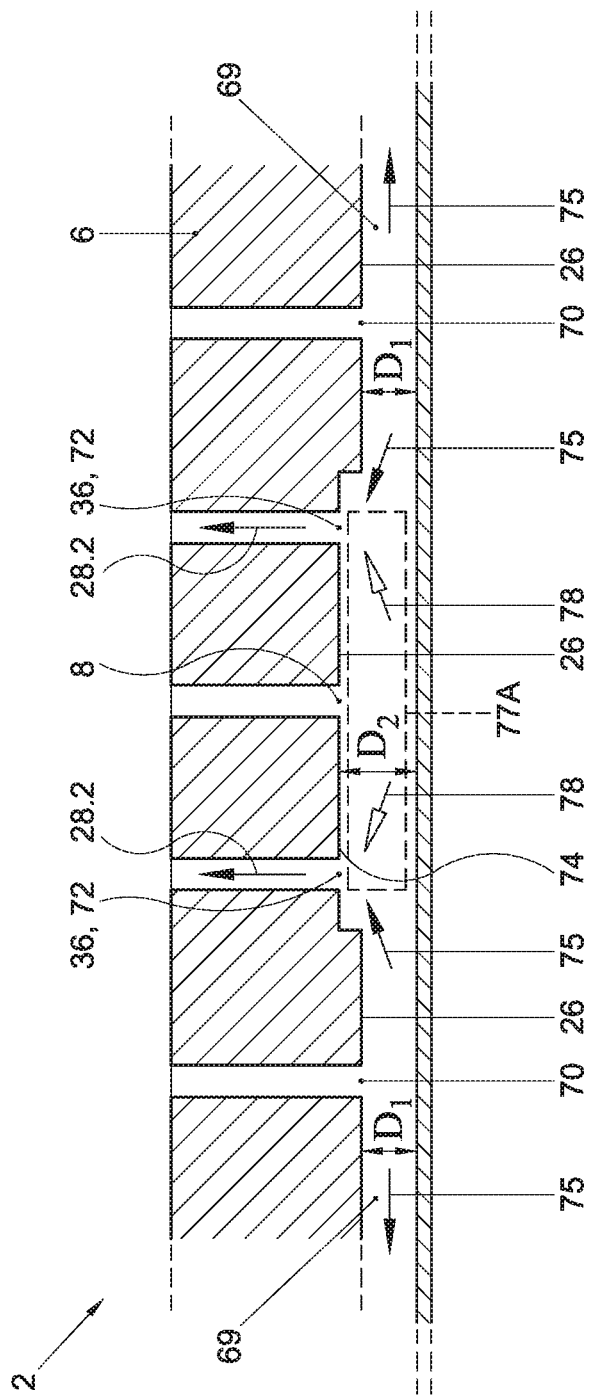

In variations of the apparatus 2 in the second embodiment, e.g. as shown in FIGS. 5 en 6, the deposition head may be provided with a cavity 74 that, in use, faces the substrate 4. Such variations may, in addition to the rotatable deposition head 6 of the second embodiment, also relate to a deposition head with a planar or curved output face 26 that is, in use, moved linearly along the substrate 4 or is stationary positioned while the substrate 4 is in motion. A depth of the cavity 74 may be defined as a local increase in distance between the output face 26 and the substrate 4. In FIG. 5 this increase in distance equals $D_2$ minus $D_1$, wherein $D_1$ is a distance between the output face 26 and the substrate 4 adjacent to the bearing-gas supply 70 and $D_2$ is a distance between the output face 26 and the substrate 4 adjacent to the precursor-gas supply 8. More in general, $D_2$ minus $D_1$ may be in a range from 10 to 500 micrometers, more preferably in a range from 10 to 100 micrometers.

In the examples of FIGS. 5 and 6, the precursor-gas supply 8 is positioned in the cavity 74 for supplying the precursor gas in the cavity 74 towards the substrate 4. The deposition head 6 may further be provided with the precursor-gas drains 36 that are positioned in the cavity for draining the precursor gas from the cavity 74 for substantially preventing precursor gas to escape from the cavity. The deposition head 6 may further be provided with the bearing-gas supply 70 spaced apart from the cavity for supplying the bearing gas at a distance from the cavity.

In FIGS. 5 and 6, the curvature of the cylindrically shaped output face 26 and the substrate is not shown for clarity. Furthermore, in these examples, the precursor-gas drains 36 also form the bearing-gas drains 72. It may be clear, however, that, more in general, the bearing-gas drains 72 may be separate from the precursor-gas drains. The bearing-gas drains may be spaced apart from the cavity 74, i.e. the bearing-gas drains 36 may be positioned outside the cavity 74. Thus, in FIG. 6, the output face 26 is provided with the plurality of precursor-gas drains 36, a plurality of the cavities 74, and the plurality of bearing-gas supplies 70.

FIGS. 5 and 6 also show the gas-bearing layer 69, which may be substantially located outside the cavity 74. Flow of the bearing gas in the gas-bearing layer is indicated with arrows 75. FIGS. 5 and 6 also show a deposition space 77A that extends from the cavity towards the substrate 4. Because the precursor-gas supply 8 and the precursor-gas drains 36 are positioned in the cavity, the precursor gas may in use be substantially confined to the deposition space 77A. Flow of the precursor gas in the deposition space is indicated with arrows 78. FIG. 6 also shows reactant spaces 77B.

FIG. 6A shows another variation of the deposition head 6 in the second embodiment. In this variation, the apparatus comprises a selectively controllable laser 79 for reacting the precursor gas on the substrate 4 so as to form (or re-form) the atomic layer by selectively controlling the laser 79. Thereto the apparatus may comprise a laser controller. The laser controller may work together with the transportation controller, the driving controller, and/or the pressure controller. In this way, an intended, e.g. predetermined, pattern of an atomic layer or a stack of atomic layers may be deposited. Controlling the laser may be dependent on the translational velocity of the substrate and the translational velocity of the precursor-gas supply. E.g., moments at which the laser is turned on and/or off may be dependent on the translational velocity of the substrate and the translational velocity of the precursor-gas supply. Using a laser may be especially useful in combination with the rotating deposition head. A laser may be selectively controlled at relatively high frequencies that may suit the relatively fast deposition process enabled by the rotating deposition head.

FIG. 6A also shows the precursor-gas drain 36. Although not drawn in FIG. 6A, it may be clear that the deposition head may also be provided with the purge-gas supply 38 and the purge-gas drain 40. More in general, the deposition head may be provided with a plurality of lasers 79 or tunable wavelength lasers to induce wavelength-specific reaction. According to the variation of FIG. 6A, the plurality of reactant-gas supplies 42 as shown in FIG. 4 may e.g. be replaced by the plurality of lasers 79.

Figure 7:
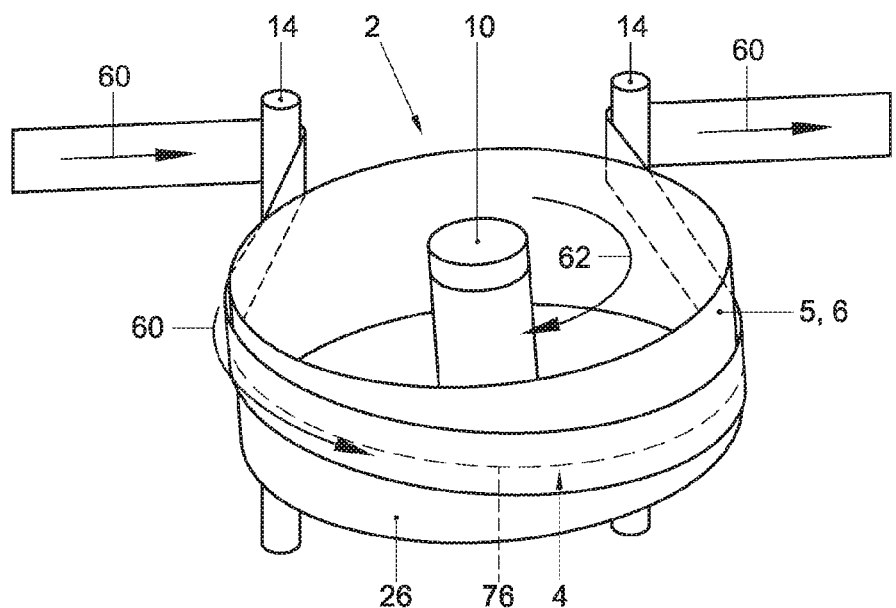
FIG. 7 shows an apparatus in a third embodiment according to the invention, in assembly with a substrate.

FIG. 7 shows an apparatus 2 in a third embodiment according to the invention, in assembly with the substrate 4. The apparatus 2 in the third embodiment may be provided with the axle 10 and the bearing 12, and may also have the output face 26. In FIG. 7, the moving direction 60 of the substrate 4 is directed against the moving direction 62 of the precursor-gas supply, which may rotate along with the rotatable wheel of the drum 5 (the wheel is not shown in FIG. 7 but is shown in FIG. 1 with reference number 5'). In FIG. 7, the substrate 4 is provided along a helical path 76 around the output face 26 of the deposition head 6. In FIG. 7, the substrate is provided less than once around the deposition head 6, i.e. around the output face 26 of the deposition head. More in general, the axis of rotation of the deposition head and/or the length axis of the axle 12 of the apparatus 2, may be inclined with respect to the length axis of one or both of the capstans 14. In this way, it may be obtained that the substrate 4 is provided along the helical path 76.

Figure 8:
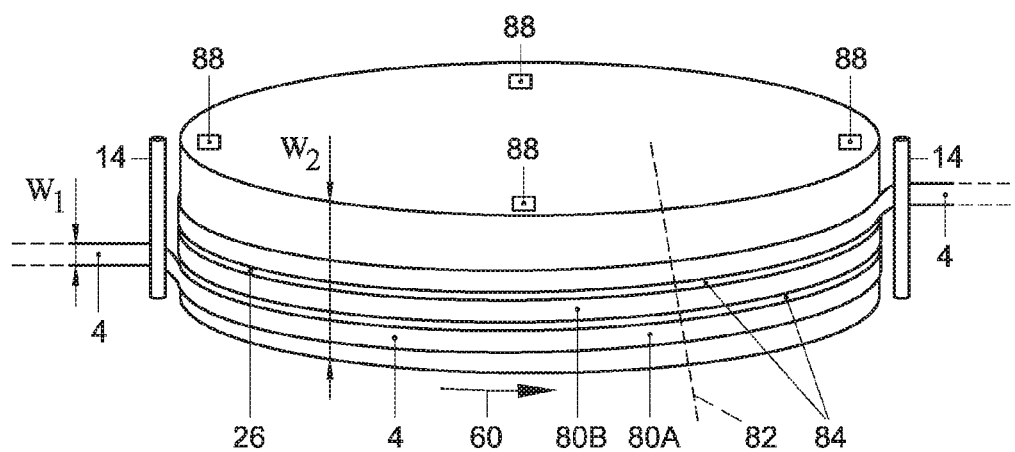
FIG. 8 shows an apparatus in a fourth embodiment according to the invention, in assembly with a substrate.

FIG. 8 shows an apparatus 2 in a fourth embodiment according to the invention, in assembly with the substrate 4. In this example, the substrate 4 is provided at least once, i.e. between two and three times, around the output face 26 of the deposition head 6 along a helical path 76. Or, in other words, the substrate makes at least one turn, i.e. between two and three turns, around the deposition head 6 along the output face 26. As a result, at a moment in time, a first part 80A of the substrate 4 that is to be moved around the rotating deposition head at least once is located besides a second part 80B of the substrate 4 that has moved around the rotating substrate one time more than the first part 80A of the substrate 4. Here, the term 'besides' may be interpreted in such a way that the first part 80A and the second part 80B of the substrate extend along the same imaginary line 82 that is directed along the first part 80A and the second part 80B of the substrate 4 and transverse to the moving direction 60 of the substrate 4. A sealing element (not shown) may be a helically formed shield structure following the helical path form of the substrate and covering the slit or gap 84 formed between mutually opposed sides of the substrate. The shield structure may be formed as a cleanable liner structure or a sacrificial structure, In addition, suction may be provided in the shielding structure to remove escaping process gases.

In the fourth embodiment, the apparatus 2 may be provided with a leaked-gas drain for draining the precursor gas that has leaked through the gap 84 between the first part 80A and the second part 80B of the substrate 4 forming mutually opposed sides 80A and 80B, respectively.

In FIG. 8, positions 88 are indicated along the circumference of the output face 26 where the precursor-gas supplies 8 may be positioned. In this example, the deposition head 6 is provided with four precursor supplies 8. As in this example the substrate 8 faces the whole of the precursor supplies 8, the precursor supplies 8 are not visible in this example. Hence, more in general, at least one precursor-gas supply may be positioned along the circumference of the output face.

As may be clear from FIG. 8, a width $W_1$ of the substrate 4 may be substantially smaller, e.g. at least two times smaller, than a width $W_2$ of the deposition head 6. However, alternatively, the width $W_1$ of the substrate 4 may be approximately equal to the width $W_2$ of the deposition head 6. This is visible in FIGS. 7 and 9. As another example, the width $W_1$ of the substrate 4 may be substantially larger, i.e. at least two times larger, than the width $W_2$ of the deposition head 6. In practice, all such alternatives may form valuable options for deposition one or more atomic layers.

The apparatus 2 in the first, second, third, fourth, or another embodiment, or a variation of one of these embodiments, can be used according to a method according to the invention.

A first embodiment of a method of depositing an atomic layer on a substrate according to the invention (the first method), comprises the step of supplying a precursor gas from the precursor-gas supply 8 of the deposition head 6 towards the substrate 4. The first method further comprises moving the precursor-gas supply 8 along the substrate by rotating the deposition head 6. The first method may comprise moving the substrate 4 along the precursor-gas supply 8 subsequently to and/or simultaneously with supplying the precursor gas towards the substrate 4.

In the first method, the translational velocity of the precursor-gas supply is larger than and/or is directed against a translational velocity of the substrate. The absolute value of the translational velocity of the precursor-gas supply may e.g. by at least 5 times, at least 10 times, at least 20 times, at least 50 times, at least 100 times, at least 500 times, at least 1,000 times, at least 5,000 times, and/or at least 10,000 times larger that the translational velocity of the substrate. More in general, it may be clear that if the translational velocity of the precursor-gas supply is at least N times larger than the translational velocity of the substrate, a stacked layer comprising N−1 atomic layers may be deposited.

The first method may further comprise confining the precursor gas by means of the sealing element 16. Thereto the sealing element 16 may face the output face 26 of the deposition head at locations where the substrate does not face the deposition head.

In the first method or in another method according to the invention, the separation distance D (FIG. 2A) between the substrate and the rotating deposition head may be maintained. Mechanical contact between the substrate 4 and the rotating deposition head may be prevented in this way. The separation distance D may be substantially constant around at least a part, and preferably all, of the circumference of the deposition head. The separation D may be obtained in various ways.

A second embodiment of a method according to the invention (the second method), may comprise attaching the substrate to the carrier 50. The second method may comprise moving the carrier 50 along the precursor-gas supply 8. In this way the substrate can be kept at a distance from the output face 26 of the deposition head 6. The second method may comprise moving the carrier around the guide 15 along the transportation face 56 of the guide 15. The transportation face 56 may be conformal with the output face 26 and is facing the output face 26, so that the separation distance D can be kept constant over at least part of the output face 26.

A third embodiment of a method according to the invention (the third method), may comprise supplying a bearing gas between the deposition head and the substrate for forming the gas-bearing layer 69 that separates the substrate and the deposition head. In this way the substrate can be kept at a distance from the output face 26 of the deposition head 6. The third method may comprise supplying the bearing gas from the plurality of bearing-gas supplies 70 of the deposition head 6 towards the substrate 4 for providing the gas-bearing layer.

The third method may further comprise supplying the precursor gas by means of the precursor-gas supplies 70 in the cavity 74 that is defined in the deposition head 6 and is in use facing the substrate 4. The third method may comprise draining the precursor gas by means of the plurality of precursor-gas drains 72 of the deposition head 6 from the cavity 74. In this way, escape of the precursor gas from the cavity, i.e. flow of the precursor gas out of the cavity otherwise than through the precursor drain, may be substantially prevented. In the third method, the bearing gas is preferably provided by means of the bearing-gas supplies 70 at a distance from the cavity. Thereto the bearing-gas supplies 70 may be spaced apart from the cavities 74 along the output face 26.

Figure 9:
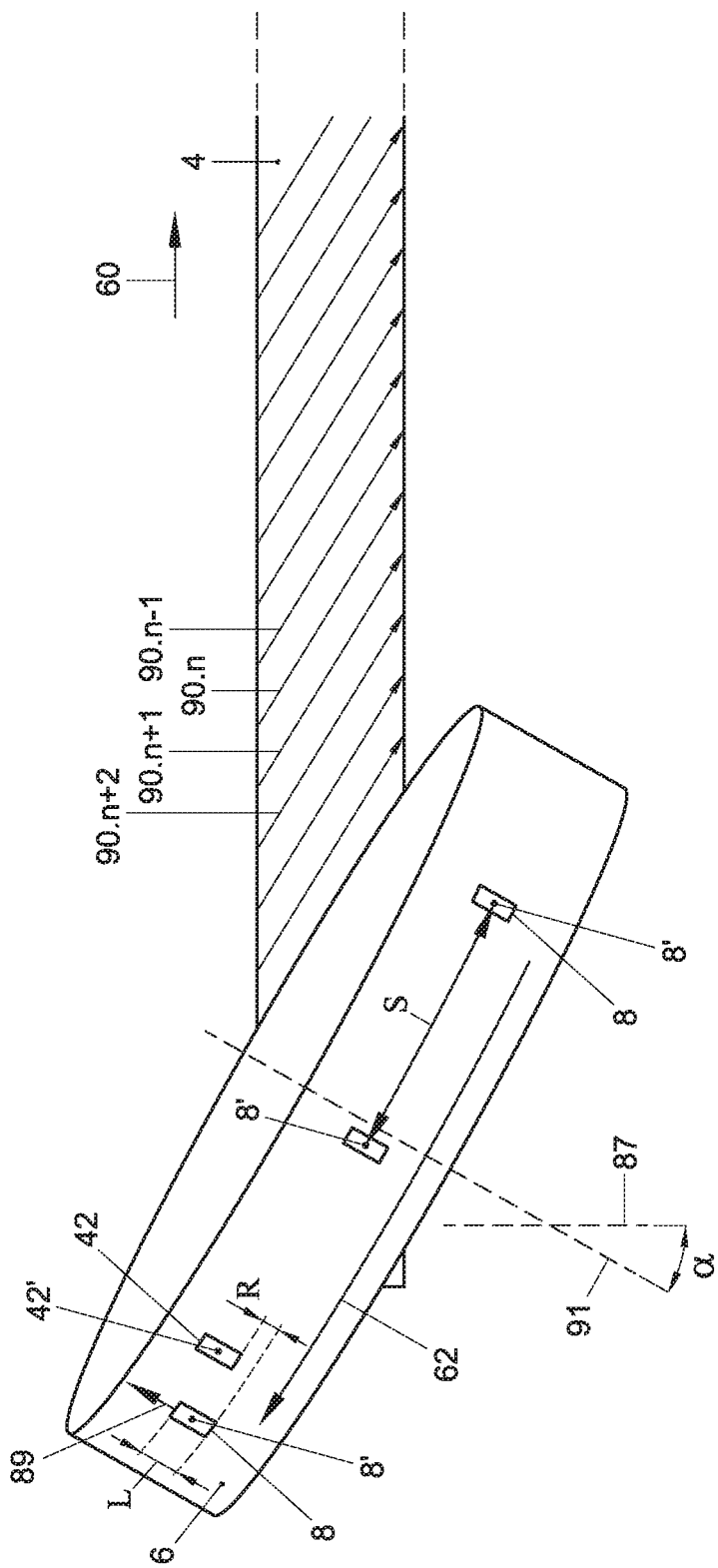
FIG. 9 schematically shows a moving direction of a substrate and a moving direction of a deposition head.

A fourth embodiment of a method according to the invention (the fourth method) may comprise moving the substrate along the helical path 76 around the deposition head 6. FIG. 9 schematically shows the moving direction 60 of the substrate 4 and the moving direction 62 of the deposition head 6. Tracks 90.*i* (i= ..., n−1, n, n+1, ...) of a center 8' of the precursor-gas supplies 8 along the substrate 4 are shown. A higher index i indicates that movement along that track happens later in time. The tracks 90.*i* can be expected to form substantially straight lines on the substrate 4. It may be clear that neighbouring tracks, e.g. tracks 90.*n* and track 90.*n*+1, may correspond to neighbouring precursor-gas supplies 8.

FIG. 9 further shows a length L of the precursor-gas supplies along a longitudinal direction 89 of the precursor-gas supplies 8, that may e.g. be shaped in elongated form. In this example the longitudinal direction 89 is aligned with respect to the axis of rotation 91 of the deposition head, although this is not necessary. E.g., the longitudinal direction 89 may alternatively coincide with the length axis 87 of at least one of the capstans 14.

The length axis 87 of at least one of the capstans 14 and/or the longitudinal direction 89 may be transverse, e.g. perpendicular, to the moving direction of the substrate 60. An angle of inclination α may be defined between the length axis 87 of at least one of the capstans 14 and the axis of rotation 91 of the deposition head 6.

A separation S can be defined between centers 8' of neighbouring precursor-gas supplies 8. In an embodiment, the length L of the precursor-gas supplies 8 and the translation velocities of the substrate and the precursor-gas supplies, may be chosen such that atomic layers deposited by neighbouring tracks 90.*i* overlap or abut each other. In this way a gap between these atomic layer may be substantially prevented.

A reactant-gas supply 42 may be similarly shaped as the precursor-gas supply 8. A location of the reactant-gas supply 42 may be offset with respect to the precursor-gas supply 8 over a distance R along the axis of rotation 91. It may be clear that the distance R may be adapted so that a center 42' of the reactant-gas supply 42 follows a similar track 90.*i* along the substrate as followed by a precursor-gas supply 8 that neighbours that reactant-gas supply 42. A similar offset can be realised for neighbouring precursor-gas supplies so that a stack of layers can be deposited from neighbouring precursor-gas supplies. FIG. 9 illustrates that, as a result of helical arrangements, various possibilities are provided for coverage of the substrate with an atomic layer. In particular, atomic layer stack geometries may be deposited that distinguish themselves as a result of their (edge) geometry. In particular, a coverage of the substrate near an edge of the substrate may be different from a coverage obtained using known methods.

Figure 9A:
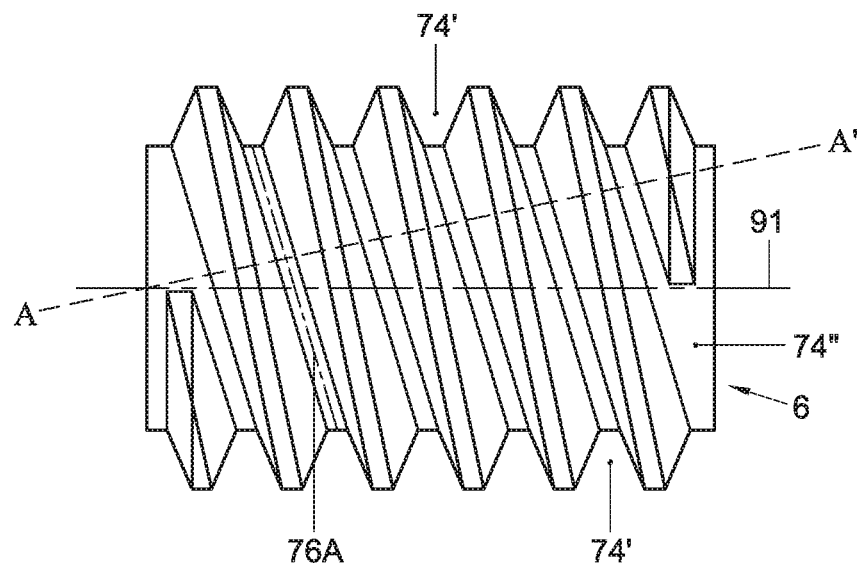
FIG. 9A shows an embodiment of a deposition head of an apparatus according to the invention, wherein a precursor-gas supply extends along a helical path.
Figure 9B:
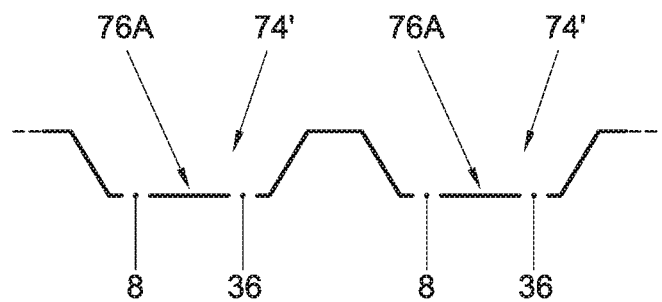
FIG. 9B shows a part of a cross-section A-A' as indicated in FIG. 9A.

Hence, it may be clear that a precursor-gas supply or an array of precursor-gas supplies may extend along a helical path over the output surface. FIG. 9A shows an embodiment of a deposition head 6 of an apparatus according to the invention, wherein a precursor-gas supply extends along a helical path 76A. FIG. 9A also shows the axis of rotation 91. FIG. 9B shows a part of a cross-section A-A' as indicated in FIG. 9A. A precursor-gas drain 36 or an array of precursor-gas drains may extend along the helical path 76A, e.g. in parallel with the precursor-gas supply 8 or the array of precursor-gas supplies 8. The precursor-gas supply and/or the precursor-gas drain may be shaped in elongated form (an array of precursor-gas supplies may be regarded as a precursor-gas supply being shaped in elongated form). A longitudinal direction of said elongated form may extend along the helical path 76A over the output surface, and in this example more than once around the axis of rotation. Hence, the precursor-gas supply may be shaped in elongated form inclined to an axial direction of the deposition head. Thus, more in general, a precursor-gas supply or an array of precursor-gas supplies, and a precursor-gas drain or an array of precursor-gas drains, may extend along a helical path. The deposition head may be provided with a helical cavity 74'. The helical cavity 74' may, in use, faces the substrate. The precursor-gas supply 8 or the array of precursor-gas supplies 8 may be preferably positioned in the helical cavity 74' for supplying the precursor gas in the helical cavity 74' towards the substrate. The precursor-gas drain 36 or the array of precursor-gas drains 36 may be preferably positioned in the helical cavity 74' for draining the precursor gas from the cavity 74'.

In an embodiment, draining the precursor gas by means of the precursor-drain 36 may be omitted. The precursor-drain 36 may be absent in the helical cavity 74' along the helical path 76A or may be unused. Omitting draining the precursor gas through the drain 36 may be enabled by the precursor-gas supply extending along the helical path 76A. Draining of the precursor-gas through the helical cavity may occur as a result of rotation of the deposition head 6. Such may result from the arrangement of the precursor-gas supply in the helical cavity 74' along the helical path 76A. At an end 74" of the helical cavity 74', a provision for collecting drained precursor gas may be provided.

In a variation the fourth method may comprise, when moving the substrate 4 along the precursor-gas supply 8, moving the substrate 4 at least once around the deposition head 6. As a result, at a moment in time, the first part 80A of the substrate that is to be moved around the rotating deposition head at least once is located besides the second part 80B of the substrate 4 that has moved around the rotating substrate one time more than the first part 80A of the substrate, so that the first and second part of the substrate extend along the same line that is directed along the first and second part of the substrate and transverse to a moving direction of the substrate. The fourth method may further comprise draining the precursor gas that has leaked through the gap 84 between the first part 80A and second part 80B of the substrate 4.

The first, second, third, and fourth method may enable depositing a continuous stack of atomic layers, i.e. a stack of atomic layers wherein a seam between edges of two laterally neighbouring atomic layers may be prevented. However, when carrying out a method according to the invention, such a continuous stack of atomic layers does not necessarily have to be achieved. For example, a fifth embodiment of a method according to the invention (the fifth method) may comprise depositing a stack 92 of atomic layers on the substrate, comprises realizing relative reciprocating motion between the precursor-gas supply and the substrate, which reciprocating motion comprises back-turning or reversing a direction of motion between the precursor-gas supply and the substrate at two subsequent back-turning positions. FIG. 10 illustrates the fifth method.

FIG. 10 shows the stack of layers 92 and shows subsequent back-turning positions 94.$i$ ($i$= . . . , n−1, n, n+1, . . . ). Herein a higher index i corresponds with a later moment in time. In FIG. 10, the layers are shown at a distance from the substrate 4 in order to indicate the moment in time at which they are deposited (indicated by the time axis 96). However, in reality, the various layers 92 will be present on the substrate 4 (as indicated by arrow 97), so that a stack of layers will be obtained with a substantially constant layer thickness 98.

In the fifth method, for example, during deposition the deposition head 6 may be rotated back and forth. Optionally, the substrate 4 may also be moved back and forth, i.e. in opposite directions 60, 64. In this way, the fifth method may comprise realizing relative reciprocating motion between the precursor-gas supply 8 and the substrate 4. Such reciprocating motion may comprise back-turning a direction of motion between the precursor-gas supply and the substrate at two subsequent back-turning positions. The two back-turning positions 94.$n$−1 and 94.$n$ can be regarded as subsequent back-turning positions, as well as the two back-turning positions 94.$n$ and 94.$n$+1.

An atomic layer 92A may be deposited between the back-turning positions 94.$n$−1 and 94.$n$. This atomic layer 92A may be offset with respect to a previously deposited atomic layer 92B. This means that an edge 100A of the atomic layer 92A deposited between the back-turning positions 94.$n$−1 and 94.$n$ is laterally, i.e. in a direction in which the substrate 4 extends, displaced with respect to an edge 100B of the previously deposited atomic layer 92B.

As a result of the offset, the edge 100A of the atomic layer 92A deposited between the back-turning positions is at a different position from the substrate than a main part 102A of the atomic layer 98A deposited between the back-turning positions.

However, despite the offset, the edge 100A of the atomic layer deposited between the subsequent back-turning positions 94.$n$−1 and 94.$n$ may be adjacent to an edge of an atomic layer deposited between the subsequent back-turning positions 94.$n$ and 94.$n$.1. The main parts of these layers are similarly positioned from the substrate.

The fifth method may also be carried out by linearly moving the deposition head 6, instead of a rotating the deposition head 6.

It may be clear from the above and from FIGS. 1-11B that, more in general, a method according to the invention preferably comprises moving the substrate along a, preferably at least partly rounded, circumference of a rotatable drum, in particular of a rotating drum. An apparatus according to the invention preferably is arranged for moving the substrate along a, preferably at least partly rounded, circumference of a rotatable drum.

In a generally applicable but optional embodiment, the output face and/or the drum may, for at least a part of the output face and/or the drum or for the whole of the output face and/or the drum, have a substantially cylindrical, conical, or frustum shape or may be substantially shaped as at least a part of a cylinder, a cone, or a frustum.

The inventors realised that the invention may e.g. be used in the field of manufacture of packages. A package may e.g. be packages for food, in particular packages for beverages. Alternatively, a package may be a package of a display, in particular an organic light emitting diode display. A method according to the invention may optionally comprise depositing an atomic layer, preferably a stack of atomic layers, on a package sheet. An apparatus according to the invention may optionally be arranged for depositing an atomic layer, preferably a stack of atomic layers, on a package sheet. Hence, the substrate may optionally be a package sheet. Such a package sheet may be part of a package or may be arranged for forming a package there from. By means of atomic layers, a barrier for gas (e.g. oxygen or water vapour) and/or fluids may be formed on the package. A barrier comprising atomic layers may provide a relatively reliable seal. Leakage through a barrier comprising atomic layers may be relatively low.

It may be clear from the above and from FIGS. 1-11B that, more in general, an axis of rotation of the deposition head and/or the drum may be directed along, or may be directed inclined with, the output face and/or a plane of a substrate surface on which the atomic layer is to be deposited.

It may also be clear from the above and from FIGS. 1-11B that the precursor-gas supply may extend, along a curved output face, in a direction along or inclined with the axis of rotation of the deposition head. This may enable homogeneous deposition of an atomic layer on the substrate.

It may be further clear from the above and from FIGS. 1-11B that an apparatus according to the invention may comprise, and/or a method according to the invention may be carried out using: an output face that extends along and/or over an, at least partly rounded, circumference of the drum; a precursor-gas supply that is positioned on an, at least partly rounded, circumference of the drum; a precursor-gas supply that is positioned on an, at least partly rounded, circumference of the output face; an output face that is, at least partly, substantially rounded around the axis of rotation of the deposition head and/or an axis of rotation of the drum; a mount for rotatably mounting a drum that comprises the deposition head; a deposition head that is part of a rotatable drum; a precursor-gas supply that extends over a curved output face; and/or a deposition head having an axial direction and/or axis of rotation that is directed along with or inclined to the substrate, wherein an angle of inclination between the substrate and the axis of rotation preferably is smaller than 30 degrees. Additionally or alternatively, a method according to the invention may comprise: providing the deposition head and/or the drum mounted on an axle, and providing at least the precursor gas through the axle towards the precursor-gas supply.

Thus, the invention provides a method of depositing an atomic layer on a substrate, which method comprises supplying a precursor gas from a precursor-gas supply comprised by a deposition head towards the substrate; having the precursor gas react near, e.g. on, the substrate so as to form an atomic layer, and further comprises moving the precursor-gas supply along the substrate by rotating the deposition head while supplying the precursor gas, wherein moving the substrate along the precursor-gas supply comprises moving the substrate along a helical path around the deposition head. The invention further provides an apparatus for depositing an atomic layer on a substrate, the apparatus comprising a deposition head having a precursor-gas supply for supplying a precursor gas towards the substrate, the apparatus further comprising a mount for rotatably mounting the deposition head and comprising a driver arranged for rotating the deposition head so as to move the precursor gas supply along the substrate; said deposition head being constructed for having the supplied precursor gas react near, e.g. on, the substrate so as to form an atomic layer, the apparatus further comprising a guide having a length axis inclined relative to a rotational axis of the deposition head; in such a way as to guide the substrate along a helical path around the deposition head.

The invention is not limited to any embodiment described herein and, within the purview of the skilled person, modifications are possible which may be considered within the scope of the appended claims. For example, the term 'substrate' as used herein may refer to a part of a plate or roll that in practice sometimes also is indicated with the term 'substrate': e.g. the expression 'moving the substrate along the precursor-gas supply' as used herein does not require moving the entire plate or roll along the precursor-gas supply; e.g. the expression 'providing the substrate at least once around the deposition head' does not require that the whole plate or roll is moved around the deposition head. As yet another example, the translational velocity of the precursor-gas supply (e.g. indicated by arrow 62 in FIG. 11) may be directed transverse to the translational velocity of the substrate (e.g. indicated by arrow 60 in FIG. 11) when the precursor-gas supply is located adjacent to the substrate. Hence, the axis of rotation 91 of the deposition head may be aligned with the moving direction 60 of the substrate, as shown in FIG. 11A. An angle between the moving direction 60 of the substrate and the axis of rotation 91 of the deposition head 6 may be in a range from 0 degrees to 90 degrees. A variation of the example of FIG. 11A is described with respect to FIG. 11B, which shows the deposition head in a viewing direction along the axis of rotation 91 of the deposition head 6. The variation of FIG. 11B differs from the example of FIG. 11A in that the substrate 4 is wrapped around the deposition head 6. Equally all kinematic inversions are considered inherently disclosed and to be within the scope of the present invention. The use of expressions like: "preferably", "in particular", "especially", "typically" etc. is not intended to limit the invention. The indefinite article "a" or "an" does not exclude a plurality. Features which are not specifically or explicitly described or claimed may be additionally comprised in the structure according to the present invention without deviating from its scope. For example, the deposition head may be provided with a heater for realizing an elevated temperature, for example near 220° C., of a part of the substrate during atomic layer deposition on that part of the substrate. As another example, the apparatus may be provided with a pressure controller for controlling gas pressure in the cavity, in the precursor-gas supply, the precursor-gas drain, the reactant-gas supply, the reactant-gas drain, the bearing-gas supply, and/or the precursor-gas drain. The pressure controller may comprise the gas controller. Furthermore, the apparatus may e.g. comprise a micro-plasma source or another source suitable for enhancing the reactivity of the precursor-gas material during deposition on the substrate or for post-deposition treatment after deposition on the substrate. It may be clear that, in addition to or alternative to rotating the deposition head, reciprocating the deposition head may provide valuable deposition options.

What is claimed is:

1. A method for depositing a plurality of atomic layers on a substrate, the method comprising:
    supplying a precursor gas from an output face of a deposition head towards the substrate, the output face having a substantially rounded shape at least partly defining a movement path of the substrate;
    rotating the deposition head, with a rotational frequency controlled by a driving controller, while supplying the precursor gas; and
    moving the substrate along the movement path with a translational velocity controlled by a transportation controller to deposit the plurality of atomic layers while continuously rotating the deposition head in one direction of rotation,
    wherein the driving controller and transportation controller impart, in conjunction, different rates and/or directions of movement between the deposition head and substrate.

2. The method of claim 1, wherein the movement path of the substrate is along an at least partly rounded circumference of a rotatable drum that comprises the deposition head.

3. The method according to claim 1, wherein the precursor gas is supplied along the output face, in a direction along or inclined with the axis of rotation of the deposition head through an elongated precursor gas supply formed along, or inclined with respect to, an axial direction of rotation of the deposition head.

4. The method of claim 3, further comprising supplying the precursor gas in a direction that is transverse with respect to the axial direction of rotation of the deposition head.

5. The method of claim 4, wherein a longitudinal direction of said elongated precursor gas supply form extends along a helical path over the output face.

6. The method of claim 5, wherein the elongated precursor gas supply form extends at least one full rotation about the deposition head.

7. The method of claim 1, wherein the movement path of the substrate is along a precursor gas supply on the output face of the deposition head, and wherein the substrate is moved along the movement path, subsequently to or simultaneously with supplying the precursor gas from the output face, for at least one full rotation of the deposition head.

8. The method of claim 1, wherein the movement path of the substrate is along a precursor gas supply on the output face of the deposition head, and wherein the substrate is moved along the movement path, subsequently to or simultaneously with supplying the precursor gas from the output face, for less than one full rotation of the deposition head.

9. The method of claim 1, wherein the movement path of the substrate is a helical path along a precursor gas supply on the output face of the deposition head, the method comprising moving the substrate along the helical path around the output face of the deposition head.

10. The method of claim 1, further comprising supplying a bearing gas between the deposition head and the substrate for forming a gas-bearing layer that separates the substrate and the deposition head.

11. The method of claim 10, wherein the gas-bearing layer provides a bearing stiffness to separate the substrate and the deposition head between $10^3$ and $10^{10}$ newtons per millimeter.

12. The method of claim 10, wherein the bearing gas is supplied from a bearing gas supply on the output face of the deposition head towards the substrate for providing the gas-bearing layer, and wherein the precursor gas is supplied from a precursor-gas supply in a cavity on the output face of the deposition head and faces the substrate, the method further comprising draining the precursor gas into a precursor gas drain on the output face of the deposition head from the cavity, thereby substantially preventing the precursor gas from escaping the cavity, wherein the bearing gas supply is at a distance from the cavity.

13. The method of claim 1, wherein the driving controller and transportation controller, in conjunction, impart a translational velocity of the deposition head that is greater than the translational velocity of the substrate.

14. The method of claim 13, wherein the driving controller and transportation controller, in conjunction, impart a translational velocity of the deposition head that is at least 5 times greater than the translational velocity of the substrate.

15. The method of claim 14, wherein the driving controller and transportation controller, in conjunction, impart a translational velocity of the deposition head that is at least 10 times greater than the translational velocity of the substrate.

16. The method of claim 15, wherein the driving controller and transportation controller, in conjunction, impart a translational velocity of the deposition head that is at least 10 times greater than the translational velocity of the substrate.

17. The method of claim 16, wherein the driving controller and transportation controller, in conjunction, impart a translational velocity of the deposition head that is at least 100 times greater than the translational velocity of the substrate.

18. The method of claim 1, wherein the rotational frequency, controlled by the driving controller, is 0.1 revolutions per second or more.

19. The method of claim 1, further comprising confining the precursor gas using a sealing element, wherein the sealing element faces the deposition head at locations outside of where the substrate faces the deposition head.

* * * * *